(12) United States Patent
Shearman et al.

(10) Patent No.: US 11,997,829 B2
(45) Date of Patent: May 28, 2024

(54) FRONT-TO-REAR AIRFLOW ASSEMBLY FOR AN EQUIPMENT CASING MOUNTED ON A RACK

(71) Applicant: Ciena Corporation, Hanover, MD (US)

(72) Inventors: Simon J. E. Shearman, Carleton Place (CA); Michael R. Bishop, Nepean (CA); Jacques Cote, Nepean (CA)

(73) Assignee: Ciena Corporation, Hanover, MD (US)

( * ) Notice: Subject to any disclaimer, the term of this patent is extended or adjusted under 35 U.S.C. 154(b) by 507 days.

(21) Appl. No.: 17/362,393

(22) Filed: Jun. 29, 2021

(65) Prior Publication Data

US 2022/0418164 A1 Dec. 29, 2022

(51) Int. Cl.
*H05K 7/20* (2006.01)
*H05K 7/14* (2006.01)

(52) U.S. Cl.
CPC ....... *H05K 7/20563* (2013.01); *H05K 7/1417* (2013.01); *H05K 7/1489* (2013.01); *H05K 7/20145* (2013.01); *H05K 7/20572* (2013.01)

(58) Field of Classification Search
CPC .......... H05K 7/20736; H05K 7/20145; H05K 7/20727; H05K 5/0213; H05K 7/1425; H05K 7/1489; H05K 7/18; H05K 7/20718; H05K 7/1424; H05K 7/183; H05K 7/1488; H05K 7/20181; H05K 7/20709; G06F 1/20; G06F 1/185
See application file for complete search history.

(56) References Cited

U.S. PATENT DOCUMENTS

| | | |
|---|---|---|
| 5,092,029 A | 3/1992 | Fisher et al. |
| 6,019,167 A | 2/2000 | Bishop et al. |
| 6,104,611 A | 8/2000 | Glover et al. |
| 6,376,779 B1 | 4/2002 | Shearman et al. |
| 6,426,876 B1 | 7/2002 | Shearman et al. |
| 6,466,724 B1 | 10/2002 | Glover et al. |
| 6,512,679 B1 | 1/2003 | Shearman et al. |
| 6,545,850 B1 | 4/2003 | Shearman et al. |
| 6,735,081 B1 | 5/2004 | Bishop et al. |
| 6,888,069 B1 | 5/2005 | Chen et al. |
| 6,948,968 B1 | 9/2005 | Shearman et al. |
| 7,043,130 B2 | 5/2006 | Ng et al. |
| 7,123,807 B2 | 10/2006 | Ng et al. |
| 7,145,773 B2 | 12/2006 | Shearman et al. |

(Continued)

FOREIGN PATENT DOCUMENTS

CA 2015499 A1 10/1991

*Primary Examiner* — Mandeep S Buttar
(74) *Attorney, Agent, or Firm* — Clements Bernard Walker; Christopher L. Bernard

(57) ABSTRACT

Systems and methods for controlling airflow through a casing or shelf assembly are provided. An apparatus, according to one implementation, includes a mount plate configured to be attached to a side panel of a casing for housing network equipment. For example, the mount plate may include a window. The apparatus also includes one or more hinges arranged at an edge of the window of the mount plate and a baffle pivotably attached to the one or more hinges. The baffle can be arranged within a range of positions with respect to the mount plate to control an amount of airflow through the window. Within these range of positions, the baffle is configured to redirect the airflow in a front-to-back direction through the casing.

20 Claims, 18 Drawing Sheets

(56) References Cited

U.S. PATENT DOCUMENTS

| | | | |
|---|---|---|---|
| 7,256,992 B1* | 8/2007 | Stewart | G06F 1/20 |
| | | | 361/679.48 |
| 8,154,867 B2 | 4/2012 | Shearman et al. | |
| 9,492,914 B2 | 11/2016 | Ng et al. | |
| 9,603,289 B1 | 3/2017 | Shearman et al. | |
| 9,769,959 B2 | 9/2017 | Mayenburg et al. | |
| 9,820,403 B2 | 11/2017 | Shearman et al. | |
| 9,915,985 B1* | 3/2018 | Chen | H05K 7/20736 |
| 10,070,553 B2 | 9/2018 | Lee et al. | |
| 10,104,799 B2 | 10/2018 | Shearman et al. | |
| 10,440,852 B1 | 10/2019 | Shearman et al. | |
| 10,624,241 B1* | 4/2020 | Ross | H05K 7/20736 |
| 10,674,241 B2 | 6/2020 | Rivaud et al. | |
| 10,924,324 B2 | 2/2021 | Rivaud et al. | |
| 11,102,914 B2 | 8/2021 | Shearman et al. | |
| 11,112,573 B2 | 9/2021 | Shearman et al. | |
| 2003/0184974 A1 | 10/2003 | Atkinson et al. | |
| 2004/0008496 A1* | 1/2004 | Larson | H05K 7/20145 |
| | | | 361/752 |
| 2005/0047074 A1 | 3/2005 | Shearman et al. | |
| 2005/0074990 A1 | 4/2005 | Shearman et al. | |
| 2005/0075001 A1 | 4/2005 | Shearman et al. | |
| 2007/0114056 A9 | 5/2007 | Cosman et al. | |
| 2008/0217962 A1* | 9/2008 | Boduch | H05K 5/0213 |
| | | | 296/204 |
| 2011/0116233 A1* | 5/2011 | Beaudoin | H05K 7/20581 |
| | | | 361/679.48 |
| 2011/0222241 A1* | 9/2011 | Shearman | H05K 7/20572 |
| | | | 361/692 |
| 2014/0153183 A1* | 6/2014 | Pofahl | H05K 7/20718 |
| | | | 361/679.46 |
| 2019/0327188 A1 | 10/2019 | Rivaud et al. | |
| 2021/0112683 A1 | 4/2021 | Mohajer et al. | |
| 2021/0132311 A1 | 5/2021 | Shearman et al. | |
| 2021/0136951 A1 | 5/2021 | Graham et al. | |

* cited by examiner

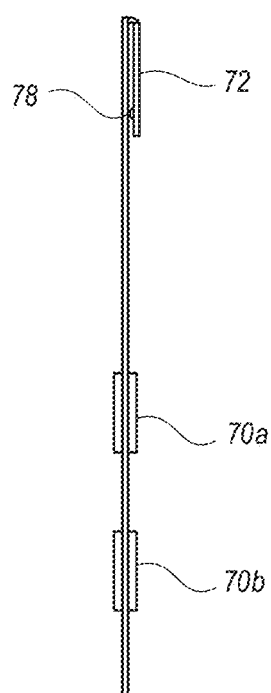
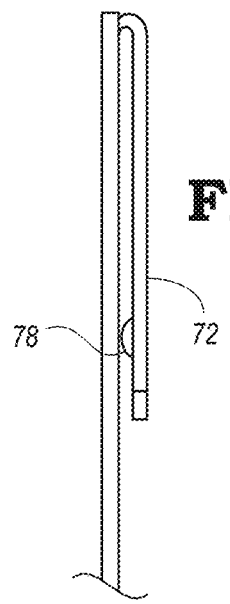
FIG. 9C
FIG. 9D
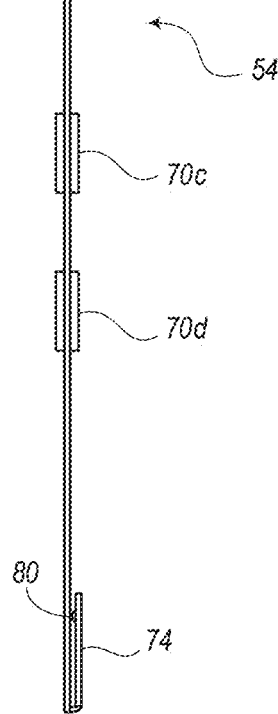
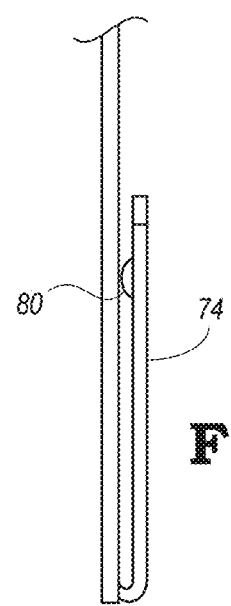
FIG. 9E

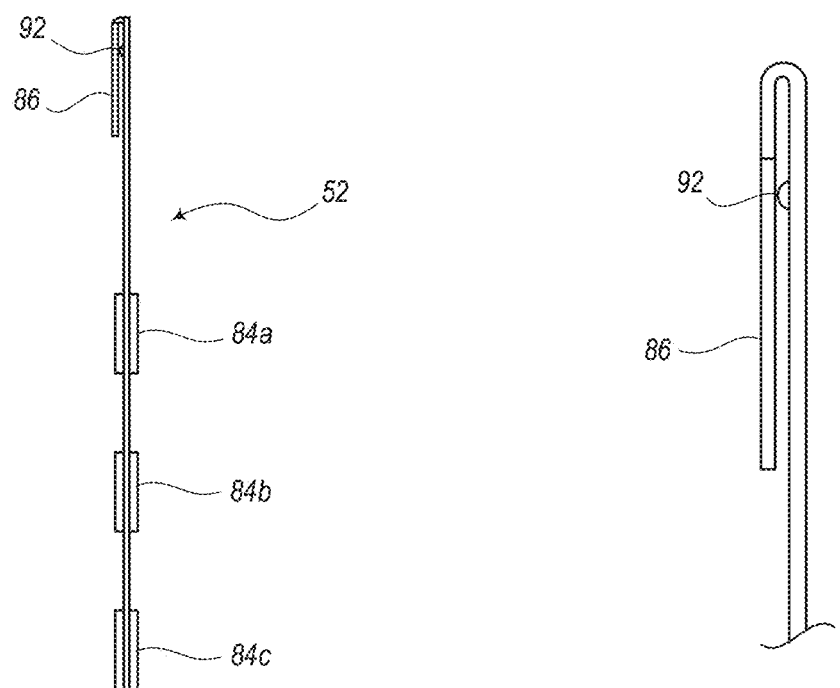
FIG. 10C
FIG. 10D
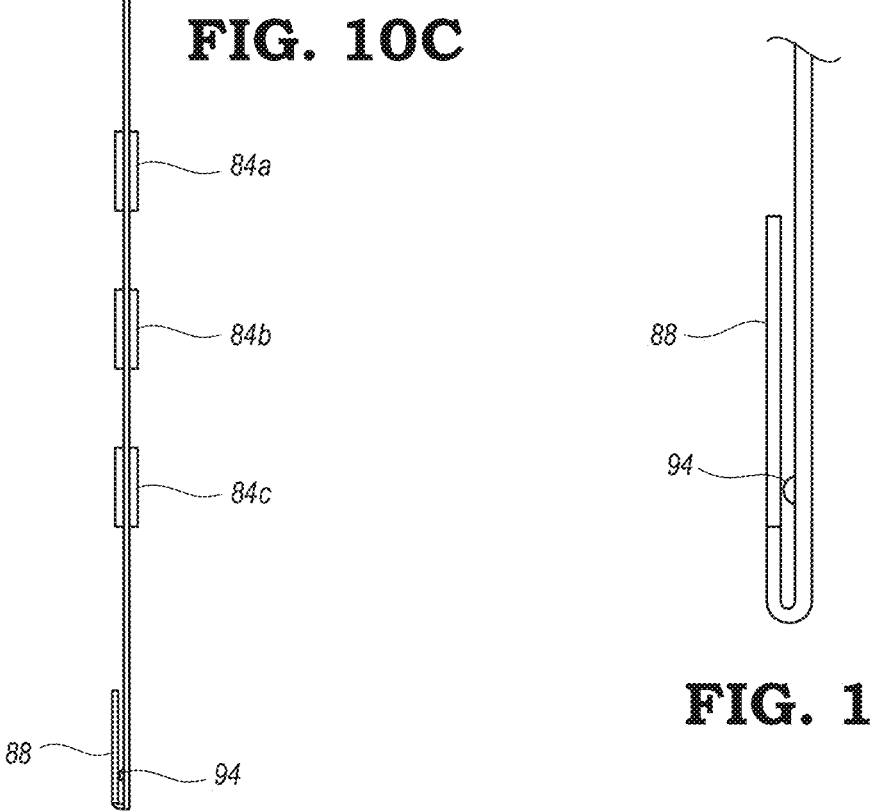
FIG. 10E

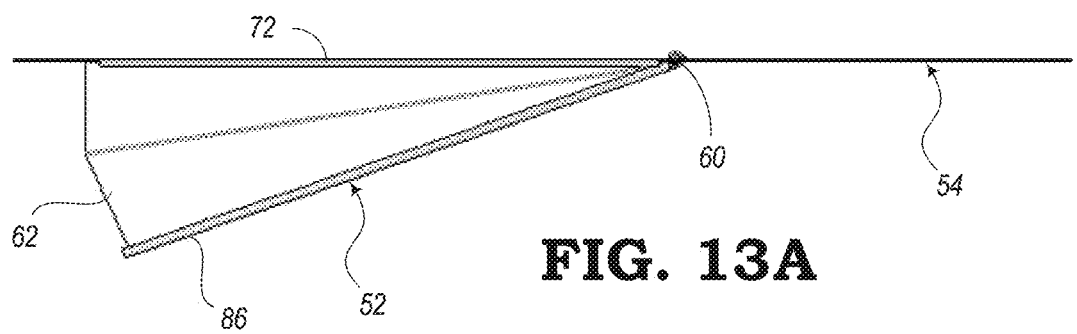
FIG. 13A
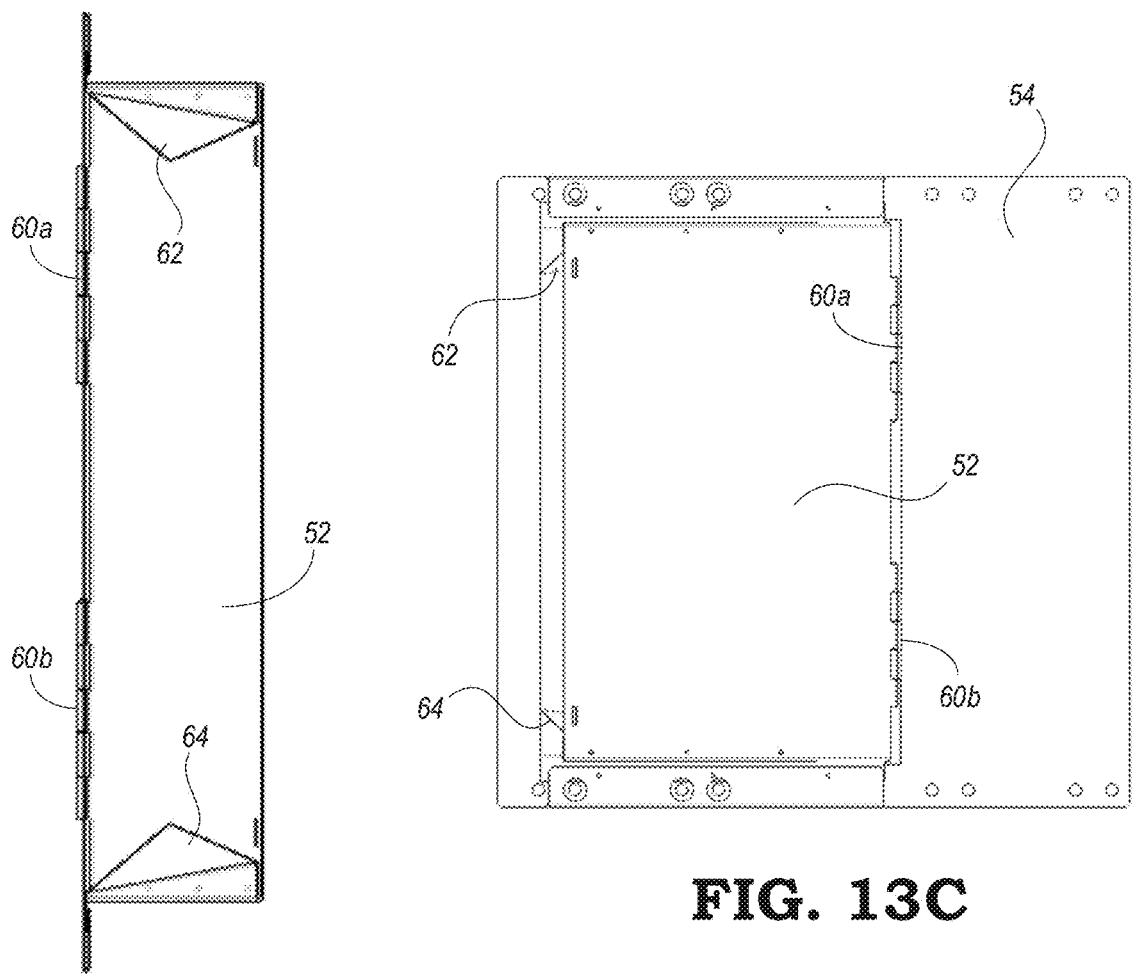
FIG. 13B
FIG. 13C

FRONT-TO-REAR AIRFLOW ASSEMBLY FOR AN EQUIPMENT CASING MOUNTED ON A RACK

TECHNICAL FIELD

The present disclosure generally relates to networking systems and methods. More particularly, the present disclosure relates to airflow or ventilation systems incorporated in a casing, shelf, or chassis for housing network equipment, the casing being supported on a rack or cabinet.

BACKGROUND

Network equipment is often stacked in a compact space on a rack or cabinet structure. In order to prevent the equipment from overheating, ventilation systems are used to move air through the cabinet. According to various guidelines and standards (e.g., Network Equipment Building System (NEBS) guidelines), network cabinets may normally include certain dimensions and should be designed with certain airflow characteristics.

Some known solutions available to rack suppliers include the use of ventilation systems that require adding a Rack Unit (1RU) or 2RU to the height of the shelf to create an air intake mechanism. In this case, a tray is usually added below or above the shelf with air inlet structures across the front. Air can travel below and then out through a side exhaust structure of the shelf, which normally leads into the side of an adjacent shelf. Similarly, air can exit the opposite side of the shelf and get baffled down to the inlet/exhaust tray above or below. Thus, with this setup, a 2RU system may become a 3RU system with the added ventilation system, thereby greatly reducing the available vertical density on the cabinet.

Although these known solutions can work well in some situations, they require extra rack height as well as many extra parts for directing airflow. Also, an installer may be required to perform extra post-install work for creating ducting paths for airflow. A second tray may need to be added underneath as well, and then side ducts may need to be added from the rear to prevent side-to-side air flow. Another option is to add a separate duct first with integrated side ducts and then add the system of interest into an add-on baffle kit. There is therefore a need in the field of network-equipment ventilation systems to avoid extra costs with respect to an increase in ducting work and labor and to avoid taking away height on a rack or cabinet while also achieving NEBS compliance.

BRIEF SUMMARY

The present disclosure is directed to systems and methods for controlling airflow through a shelf system, casing, or other housing for supporting electrical components, optical components, and other equipment within a network element. According to one implementation of the present disclosure, an apparatus for controlling airflow may include a mount plate configured to be attached to a side panel of a casing for housing network equipment, where the mount plate may include a window. The apparatus may also include one or more hinges arranged at an edge of the window of the mount plate and a baffle pivotably attached to the one or more hinges. The baffle may be configured to be arranged within a range of positions with respect to the mount plate to control an amount of airflow through the window, wherein, within the range of positions, the baffle may be configured to redirect the airflow in a front-to-back direction through the casing.

According to some implementations, the apparatus may further comprise a top accordion pleat and a bottom accordion pleat. For example, the top accordion pleat may be configured to be attached between a top edge of the baffle and a top edge of the window and the bottom accordion pleat may be configured to be attached between a bottom edge of the baffle and a bottom edge of the window. The top accordion pleat and bottom accordion pleat may be configured to limit the movement of the baffle with respect to the mount plate to within the range of positions. The mount plate may further include a first crimping edge arranged near the top edge of the window and a second crimping edge arranged near the bottom edge of the window. The first crimping edge may be configured to hold a first support strip of the top accordion pleat and the second crimping edge may be configured to hold a first support strip of the bottom accordion pleat. The baffle may further include a first crimping edge arranged at the top edge thereof and a second crimping edge arranged at the bottom edge thereof. The first crimping edge of the baffle may be configured to hold a second support strip of the top accordion pleat and the second crimping edge of the baffle may be configured to hold a second support strip of the bottom accordion pleat. The top accordion pleat may include a plurality of triangular fold elements connected together and configured to fold with respect to each other and the bottom accordion pleat may also include a plurality of triangular fold elements connected together and configured to fold with respect to each other. The baffle, top accordion pleat, and bottom accordion pleat may include a flame-retardant material.

Furthermore, the apparatus may also be defined whereby the casing can be a shelf configured to be attached to a rack of a network element. The apparatus may further comprise a clasp configured to hold the baffle in a closed position on the mount plate during a process of installing the shelf on the rack. The shelf may include a plurality of horizontal slots configured to support a plurality of circuit packs and network cards. The rack may include a 19-inch wide frame with four vertically oriented upright posts. The baffle may be configured to be moved within the range of positions between a front upright post and a rear upright post on one side of the rack.

In some additional implementations, the apparatus may also include an intake control device, similar to the exhaust control device, having a second mount plate configured to be attached to an opposite side panel of the casing, where the second mount plate may include a second window. The intake control device may also include a second set of one or more hinges arranged at an edge of the second window of the second mount plate and a second baffle pivotably attached to the second set of one or more hinges. The second baffle may be configured to be arranged within a range of positions with respect to the second mount plate to control an amount of airflow through the second window, wherein, within the range of positions, the second baffle may be configured to redirect the airflow in the front-to-back direction through the casing. In some implementations, the apparatus may further include a fan for directing the airflow in the front-to-back direction through the casing.

BRIEF DESCRIPTION OF THE DRAWINGS

The present disclosure is illustrated and described herein with reference to the various drawings. Like reference numbers are used to denote like components/steps, as appropriate. Unless otherwise noted, components depicted in the drawings are not necessarily drawn to scale.

FIGS. 9A-9E are diagram illustrating various views of a mount plate of the exhaust control device of FIGS. 7 and 8, according to various embodiments.

FIGS. 10A-10E are diagrams illustrating various views of a baffle or vane of the exhaust control device of FIGS. 7 and 8, according to various embodiments.

FIGS. 13A-13C are diagrams illustrating various views of the top accordion pleat and bottom accordion pleat when the baffle is in a partially expanded position, according to various embodiments.

DETAILED DESCRIPTION

The present disclosure relates to systems and methods for increasing airflow capacity through network equipment that is installed on a rack or cabinet. For example, one or more racks or cabinets may be placed in a central office, data center, node, or other suitable computing facility where multiple network components (e.g., switches, servers, routers, etc.) may be in operation for providing network services to multiple customers.

Network Equipment-Building Specification (NEBS) is a North American Central Office Telecommunications standards body with several governing documents. One such document, called Gr-63-CORE, contains a requirement (R4-34) that the equipment airflow shall generally be in a direction from a front side of the equipment to a rear side. Air-cooled equipment shall utilize only rear-aisle exhaust. It should be noted that the process of exhausting heated air in a side-to-side direction may be undesirable in many situations, especially since this process may essentially heat up the adjacent network equipment Telecommunications equipment in North America is typically mounted in a 19-inch rack (e.g., frame, cabinet, etc.) or a 23-inch rank for supporting various network equipment.

Airflow Control Systems

Figure 1A:
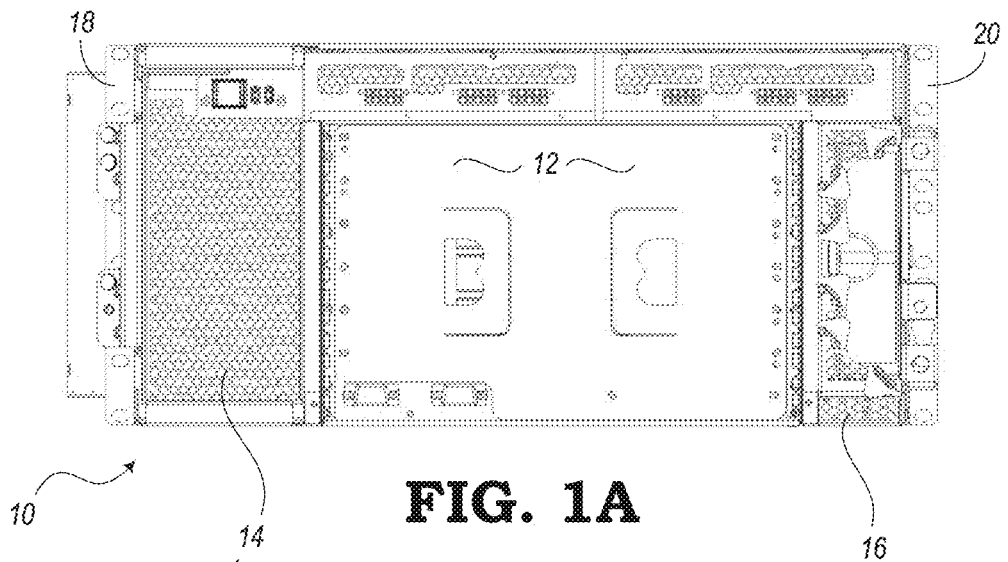
FIGS. 1A-1C are diagrams illustrating a front view of an empty shelf attached to different rack systems, according to various embodiments.
Figure 1B:
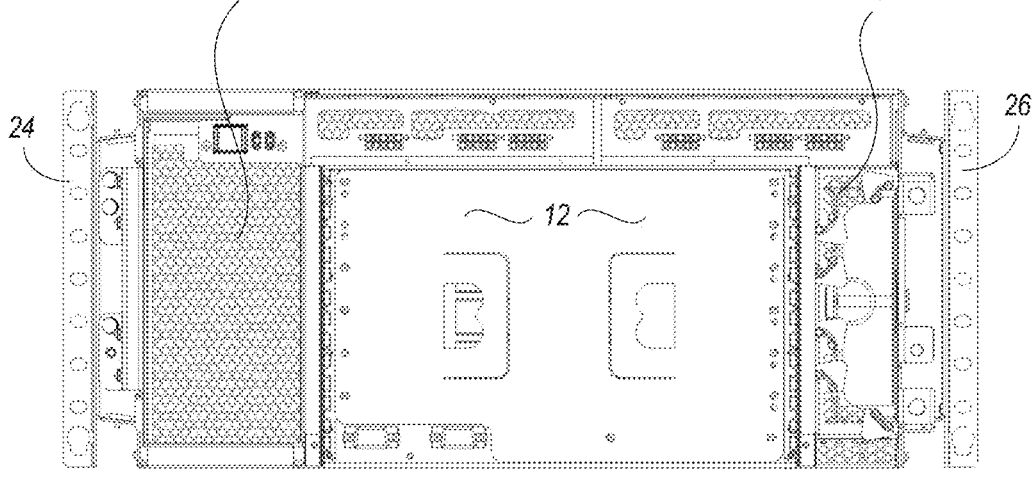
Figure 1C:
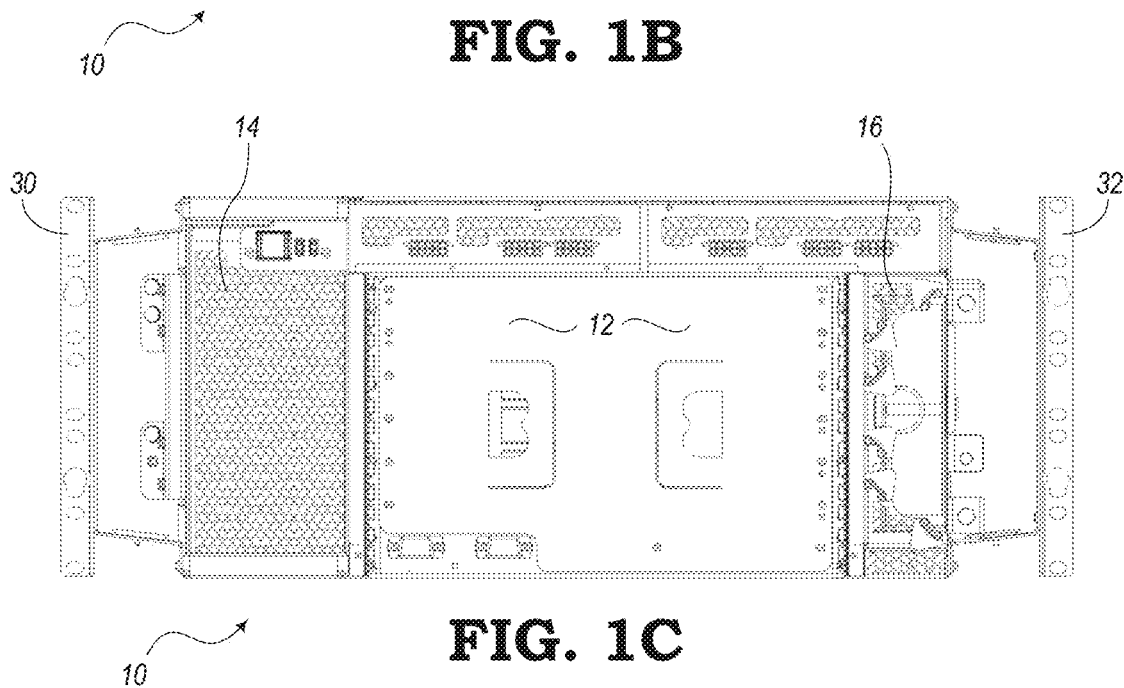

FIGS. 1A-1C are diagrams illustrating a front view of an embodiment of an empty casing 10 attached to different rack systems. The casing 10 may be referred to as a housing, shelf, shelf assembly, chassis, etc. for attachment of a rack, rack system, cabinet, etc. FIG. 1A shows the casing 10 attached to a 19-inch rack system; FIG. 1B shows the casing 10 attached to a European Telecommunications Standards Institute (ETSI) rack system; and FIG. 1C shows the casing 10 attached to a 23-inch rack system. ETSI is an independent, not-for-profit, standardization organization that supports the development and testing of global technical standards for Information and Communications Technology (ICT)-enabled systems, applications, and services.

The casing 10 is configured to support or house a number of components (not shown) while also enabling front-to-rear airflow. The casing 10 includes a number of slots 12 in which circuit packs, "pizza boxes," and/or other suitable horizontally oriented network components can be installed. The casing 10 also includes an exhaust vent 14 located on a back panel thereof. In this embodiment, the exhaust vent 14 for exhausting air may be located near or next to a side (e.g., left side panel) of the casing 10. In addition, the casing 10 includes an intake vent 16 located on a front panel thereof. The intake vent 16 may be located near or next to an opposite side (e.g., right side panel) of the casing 10 from the exhaust vent 14. In this respect, air flow may be directed diagonally through the casing 10. Not only does air flow in a front-to-back direction, but also flows from a space near one side of the casing 10 to the other side. Also, since the intake vent 16 and exhaust vent 14 extend substantially from the top of the casing 10 to the bottom, air is allowed to flow over multiple horizontally oriented equipment in a substantially horizontal direction.

With respect to FIG. 1A, the casing 10 is attached to a 19-inch rack system having at least a front-left upright post 18 and a front-right upright post 20. Other posts (e.g., back upright posts) are hidden from view in FIG. 1A. According to various embodiments, the casing 10 includes features as described in more detail below that are an improvement over conventional shelves or casings attached to 19-inch frames. For example, the improvements may enable a greater volume of air to flow through the casing 10 in a front-to-rear direction (or rear-to-front direction) to reduce the risk of overheating components mounted in the casing 10. More particularly, the casing 10 includes an exhaust (or intake) control device or other suitable airflow controlling apparatus having an expandable baffle for enabling greater airflow, if needed, while also directing air generally in a rearward (or forward) direction.

In some preferred configurations, 19-inch rack-mounting air flow requirements may include one or more side baffles or plates. For front-to-rear air flow, the casing 10 may be configured such that a front plate may be left on the fan and a right-side air blocking plate and left-side baffle may be used. This may work in 19-inch Electronic Industries Alliance (EIA) cabinets and four-post racks with space behind the front mounting uprights. Although this is a front-to-rear system, it may not be compliant with GR-63-CORE NEBS limitations because not all supported cards may pass the 55° C. ambient condition and/or fan fail tests. For a front-to-rear-left flow, the casing 10 may be configured such that a front plate may be left on the fan and a right-side air blocking plate may be used with the left-side baffle left off. This may be used in two-post racks where there is not room for the left baffle and where some left-side exhaust can be tolerated (e.g., enclosed 19" cabinets where the left side cavity is part of a "hot aisle" space). For example, a 19-inch kit does not normally support front-to-front flow. The 19-inch configuration is typically not suitable for back-to-back or 300 mm deep applications with a wall or obstruction behind the shelf. When equipped with AC power cards, unobstructed exhaust space may be required behind the shelf.

In other configurations, in a front-to-front-and-rear flow, the casing 10 may be configured such that a front fan plate may be removed and a right-side air blocking plate and left-side baffle may be used. In a front-to-front-and-rear-left flow, the casing 10 may be configured such that a front fan plate may be removed and a right-side air blocking plate only may be used. In front-right-to-rear-left flow, the casing 10 may be configured such that a front plate on the fan may be left and no side panels or baffles may be used. In front-right-to-front-left-and-rear flow, a front fan plate may be removed and no side panels and baffles may be used.

With respect to FIG. 1B, ETSI or 21-inch rack-mounting air flow requirements may include left and right air baffles. According to various configurations, a front-to-rear flow may include leaving a front plate on a fan, setting a right baffle for front air intake and a left baffle for rear exhaust. A front-to-front flow may include removing the front fan plate, attaching the rear blocking plate included in the kit to the rear of the fan, setting the right baffle for front air intake and the left baffle for front exhaust. If the casing 10 is equipped with AC power cards, unobstructed exhaust space may be required behind the casing 10 since complete front-to-front airflow may not be supported for AC-powered configurations. In other configurations, a front-to-front-and-back flow may include removing the front fan plate, setting the right baffle for front air intake and the left baffle for rear (or front) exhaust.

With respect to FIG. 1C, the 23-inch rack-mounting air flow requirements may also include left and right air baffles. According to various configurations, a front-to-rear flow may include leaving the front plate on the fan, setting the right baffle for front air intake and the left baffle for rear exhaust. This may comply with GR-63-CORE NEBS limitations. Normally, front-to-front flow is not supported with typical 23-inch mounting kits, but can be implemented by removing the fan front plate, setting the left baffle for front exhaust, and using a fan rear blocking plate from a separately ordered ETSI. In a front-to-front-and-back flow, the casing 10 may be configured by removing the front fan plate, setting the right baffle for front air intake and the left baffle for rear (or front) exhaust.

Each of the frame standards has a standard mounting aperture width and mounting hole spacing. Equipment shelves are mounted into one of these standard-sized frames where equipment mounted in 23-inch frames can be four inches wider than equipment in 19-inch frames. When equipment shelves with horizontally oriented circuit packs are mounted in a frame, air enters the front on one side and exits the rear on the other side, such as to be NEBS compliant. NEBS airflow can be achieved in 23-inch frames by creating ducts on the left and right in the four inches of extra space to direct the air flow from the front on one side and to the rear on the opposite side. In a 19-inch frame, there is typically not enough space to achieve ducts. When the flow of air enters the front and is redirected 90 degrees to cool the circuit cards, the volume of air flow can experience losses caused by eddies and other redirection consequences. The smaller the space for redirection, the more air flow volume may normally be lost. When air leaves the horizontal circuit packs and is redirected to the rear for NEBS compliance, more losses in air flow will occur due to eddies and other redirection consequences.

Therefore, one of the goals of the present disclosure is to increase the exhaust width in a 19-inch rack-mounting system to attain NEBS-level air flow direction and still have enough airflow to cool hot circuit cards. For example, this goal can be attained by the following embodiments described in the present disclosure. Specifically, a vent may be mounted on a side of the casing 10 that is narrow enough to mount within the available width of a standard 19-inch frame, but can expand beyond this width, as needed, after it is installed to increase the air redirection space.

Figure 2A:
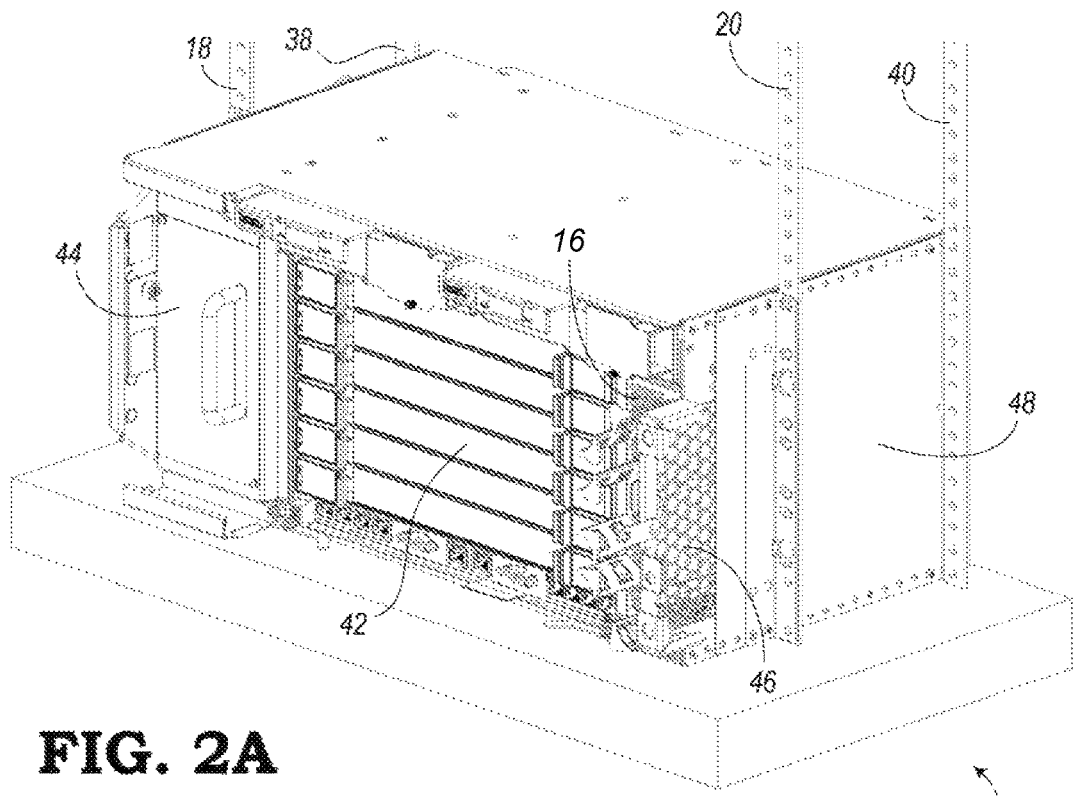
FIG. 2A is a diagram illustrating an isometric front view of a component-filled shelf attached to a 19-inch rack system, according to various embodiments of the present disclosure.
Figure 2B:
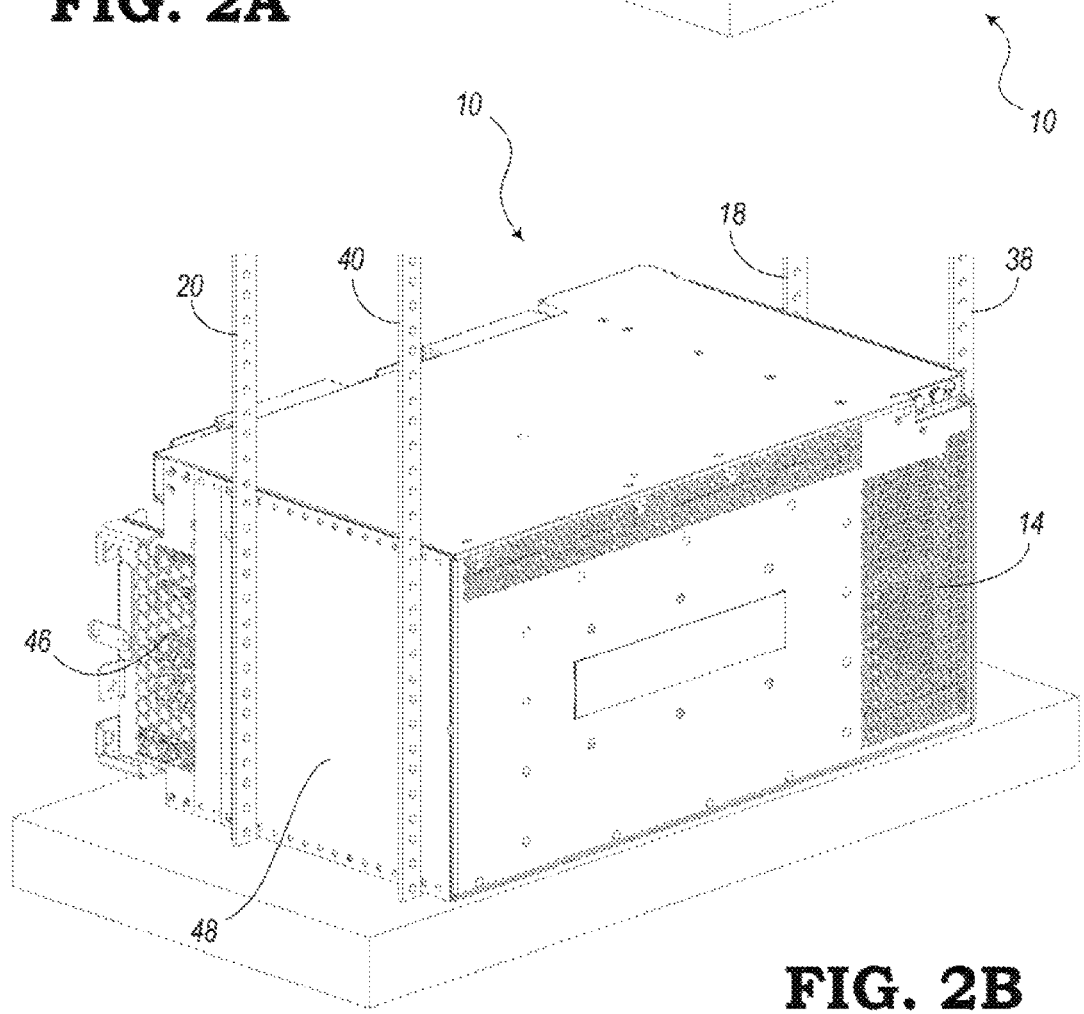
FIG. 2B is a diagram illustrating an isometric back view of the component-filled shelf of FIG. 2A attached to the 19-inch rack system, according to various embodiments.

FIG. 2A is an isometric front-right view of the casing 10 of FIG. 1 mounted on a 19-inch rack system, which includes the front-left upright post 18 and the front-right upright post 20. Also, the 19-inch rack system further includes a back-left upright post 38 and a back-right upright post 40. Suitable hardware (e.g., screws, nuts, bolts, etc.) may be used to attach the casing 10 to the rack system. FIG. 2B is a diagram illustrating an isometric back-right view of the component-filled casing 10 of FIG. 2A attached to the 19-inch rack system. As shown in FIG. 2A, the casing 10 is filled with network components, such as cards 42, a cooling unit 44, etc. In addition to the intake vent 16 on a front face of the casing 10, the casing 10, according to some embodiments, may also include another intake vent 46. For example, the intake vent 46 may be positioned on a side panel 48 (e.g., right-side panel) of the casing 10 near the front of the casing 10. According to various embodiments, the casing 10 may also be configured with addition air intake features, such as an expandible baffle in the side panel 48 (as described below with respect to FIGS. 18A and 18B.

The intake vent 46 (FIGS. 2A and 2B) may increase the air inlet or intake width. The intake vent 46 may include a screen or perforated fiber covering for allowing air to enter. The screen or perforated front right wall of the intake vent 46 may extend all the way to door mounts so that air can enter in front of the front-right upright post 20 or other rack upright structure. Also, the intake vent 46 may include an added lower channel to allow air inlet into a bottom of an air filter channel. The intake vent 46 can therefore help with front-to-rear cooling in a 19-inch frame.

Figure 3A:
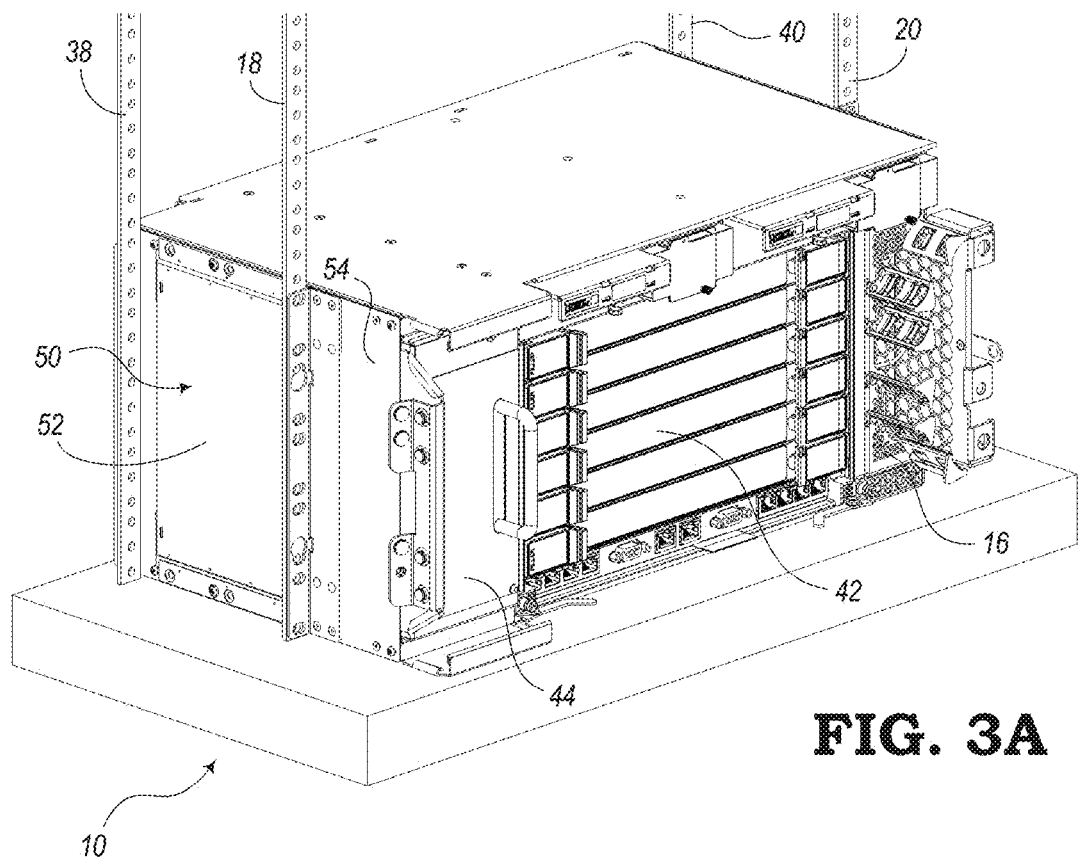
FIGS. 3A and 3B are diagrams illustrating an isometric front view of the shelf shown in FIG. 2 with an exhaust control device in collapsed and expanded positions, according to various embodiments.
Figure 3B:
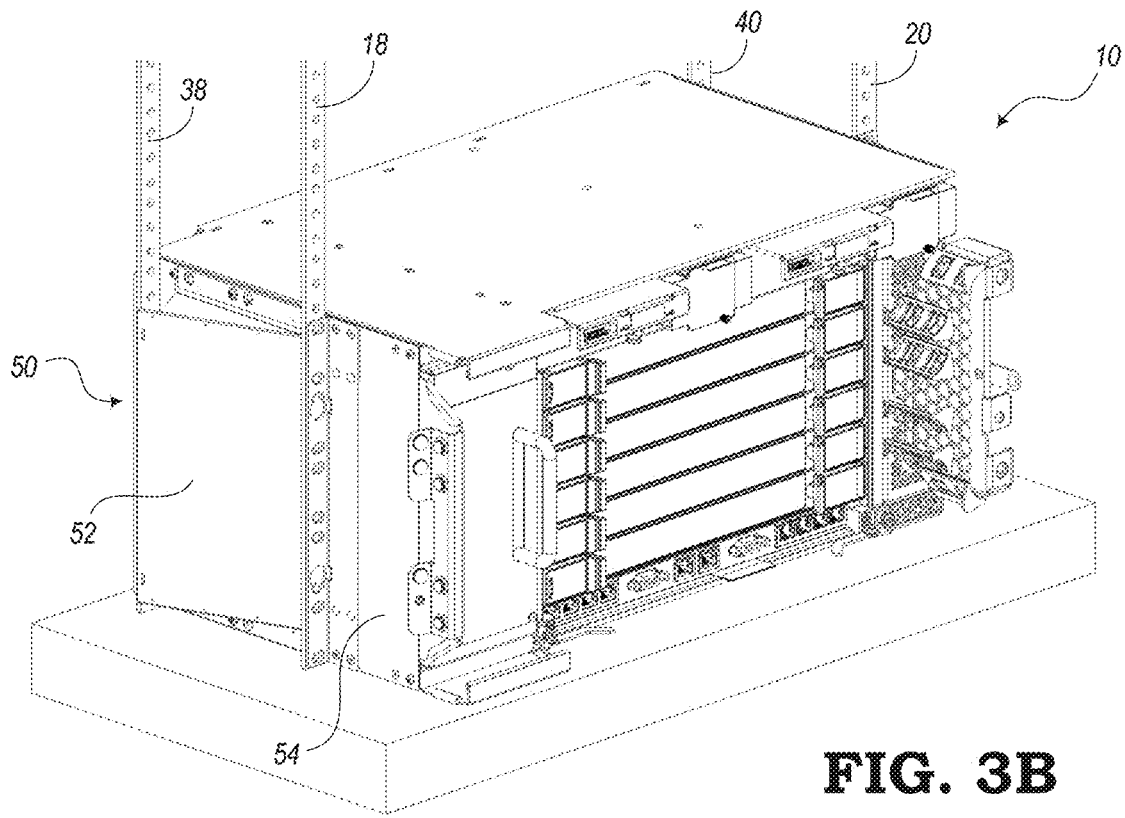

FIGS. 3A and 3B are diagrams illustrating an isometric front-left view of the component-filled casing 10 shown in FIG. 2. Also, according to various embodiments of the present disclosure, the casing 10 also includes an exhaust control device 50 for expanding the ventilation capabilities for exhausting air. The exhaust control device 50 is shown in a collapsed orientation in FIG. 3A and is shown in an expanded orientation in FIG. 3B. The exhaust control device 50 may be configured as a bellows-type duct, which may be relatively flat during installation (FIG. 3A). Then, after installation, a baffle 52 of the exhaust control device 50 may be moved outward away from the side of the casing 10 to an expanded position. For example, the baffle 52 may also be referred to as a flow-directing vane or panel. The baffle 52 is configured to extend outward within the space between the front-left upright post 18 and the back-left upright post 38 of the rack system. In some embodiments, the baffle 52 may be kept open by the air flow of a fan (not shown) located within the interior of the casing 10. The baffle 52 may be expandable to a position that causes the baffle 52 to direct air flow in a rearward direction, away from any equipment that may be located adjacent to the casing 10 (e.g., near the left side of casing 10).

Figure 4A:
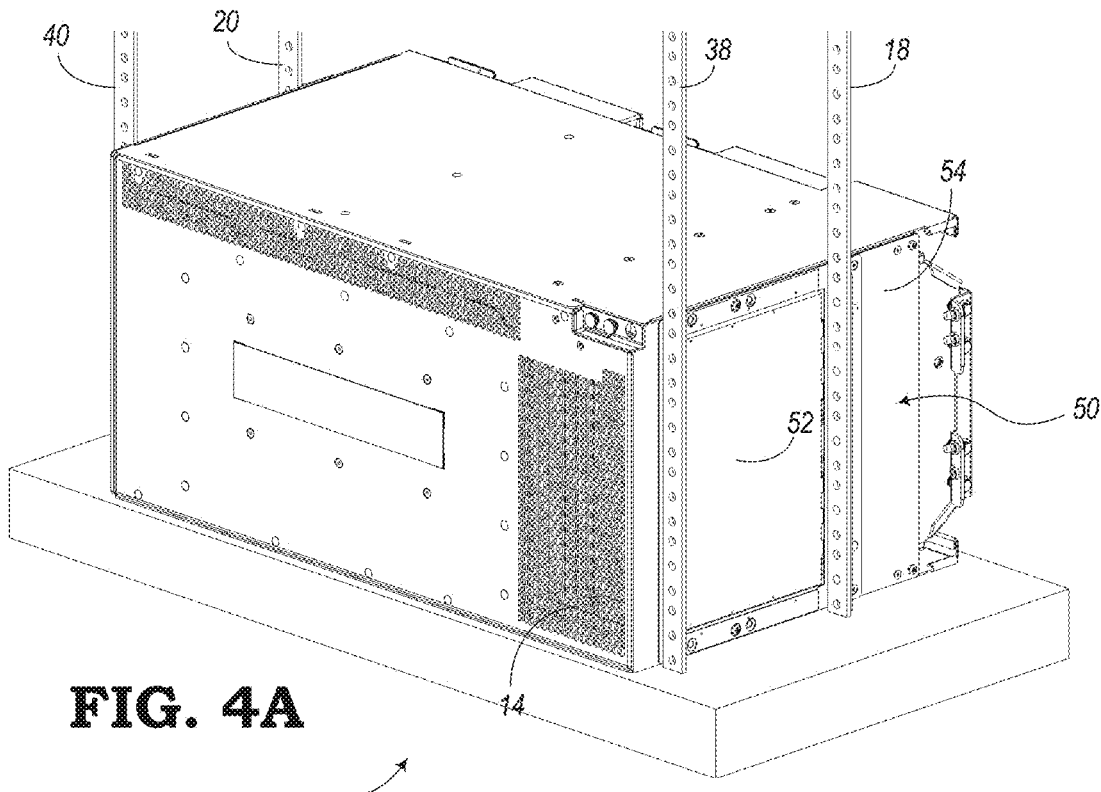
FIGS. 4A and 4B are diagrams illustrating an isometric back view of the shelf shown in FIG. 2 with the exhaust control device in the collapsed and expanded positions, according to various embodiments.
Figure 4B:
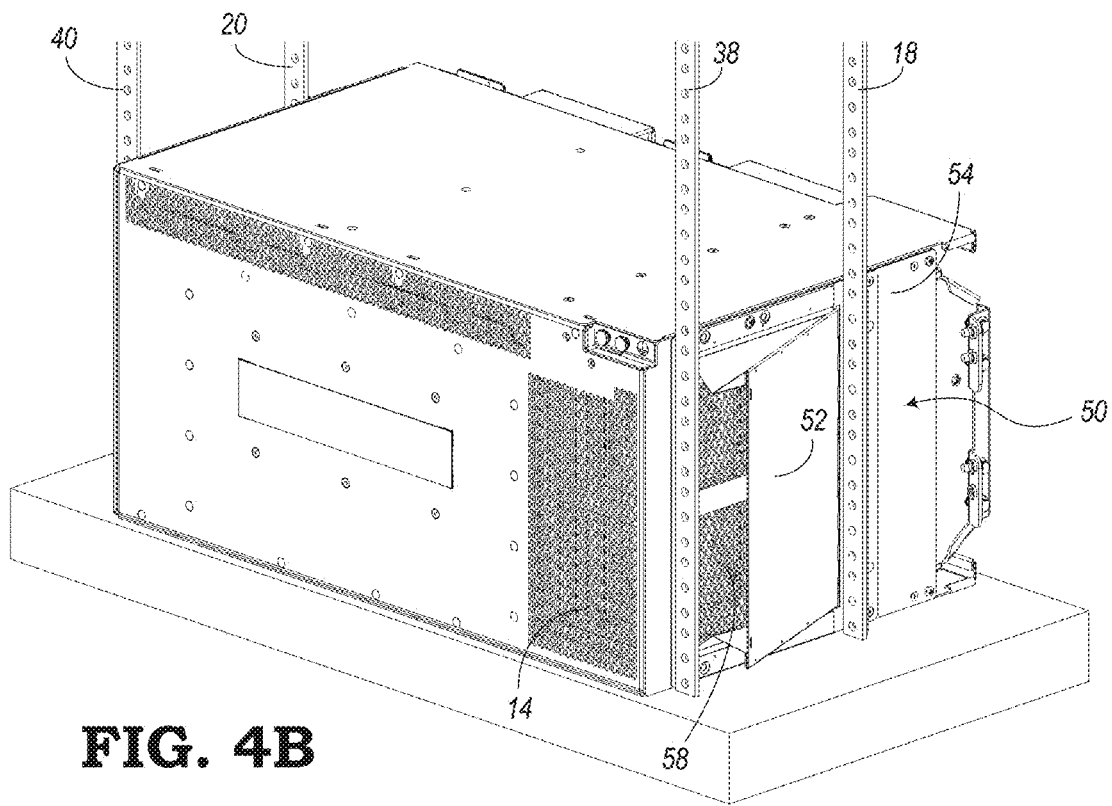

FIGS. 4A and 4B are diagrams illustrating an isometric back-left view of the casing 10. FIG. 4A shows the casing 10 with the exhaust control device 50 in a collapsed position and FIG. 4B shows the casing 10 with the exhaust control device 50 in an expanded position. The exhaust control device 50 includes a mount plate 54 configured to be mounted on one side (e.g., left side panel) of the casing 10. The mount plate 54 may be attached in a fixed position and may enable the baffle 52 to rotate with respect to the mount plate 54. The casing 10 may also include a side exhaust vent 58, which may be part of the left side panel and may be positioned beneath the mount plate. When the baffle 52 is positioned in the collapsed, folded, or closed position (e.g., near the side exhaust vent 58) as shown in FIG. 4A, little or no air flow will be directed through the side exhaust vent 58. However, when the baffle 52 is moved a sufficient distance away from the side exhaust vent 58, air flow may be at least partially directed through the side exhaust vent 58. Because of the angle of the baffle 52 with respect to the side exhaust vent 58, airflow through the side exhaust vent 58 is redirected by the baffle 52 in a rearward direction. Also, air may also be allowed to flow through the exhaust vent 14 on the back plane of the casing 10.

Figure 5A:
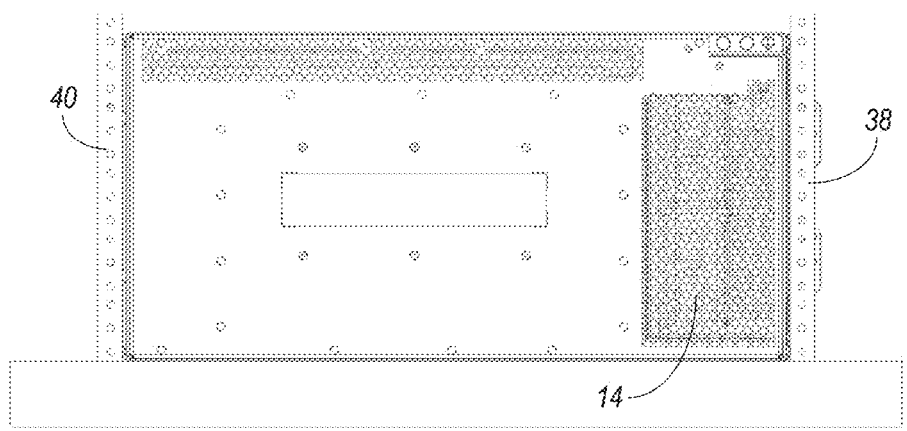
FIGS. 5A and 5B are diagrams illustrating a back view of the shelf shown in FIG. 2 with the exhaust control device in collapsed and expanded positions, according to various embodiments.
Figure 5B:
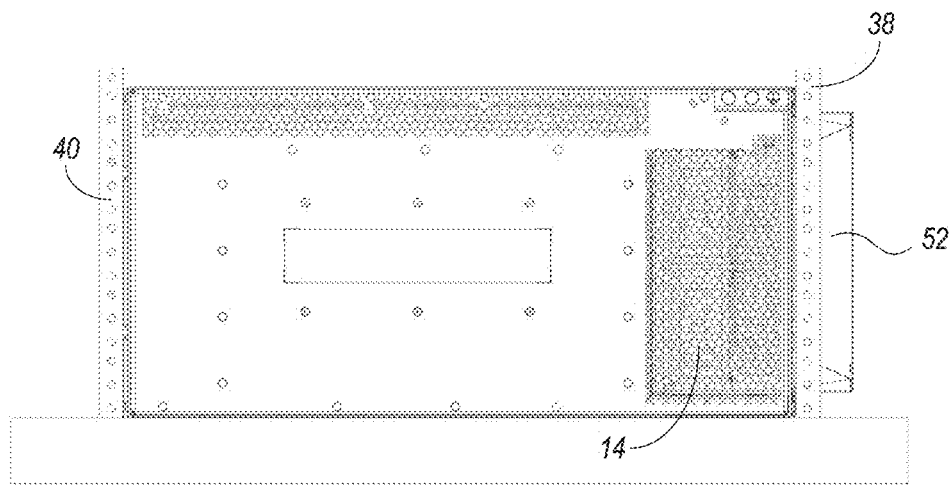

FIGS. 5A and 5B are diagrams illustrating a back view of the casing 10 having the exhaust vent 14 positioned on the back panel thereof. FIG. 5A shows a condition when the exhaust control device 50 is in the collapsed position (e.g., with the baffle 52 near the side panel of the casing 10). FIG. 5B shows a condition when the exhaust control device 50 is in the expanded position (e.g., with the baffle 52 separated from the side panel of the casing 10. The back posts 38, 40 of the rack system or frame are also shown in FIGS. 5A and 5B.

Figure 6:
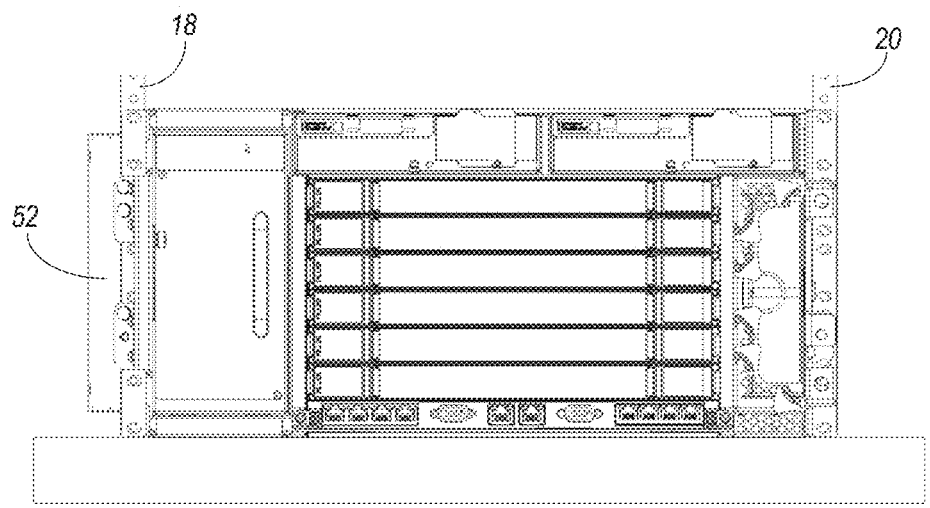
FIG. 6 is a diagram illustrating a front view of the shelf shown in FIG. 2 with the exhaust control device in the expanded position, according to various embodiments.

FIG. 6 is a diagram illustrating a front view of the casing 10 with the exhaust control device 50 in the expanded position, whereby, in the illustrated position, the baffle 52 is partially visible with the front-left upright post 18 positioned next to the casing 10. As shown, the baffle 52 in the expanded position extends beyond a plane formed by the left posts 18, 38 of the rack system.

It may be noted from the embodiments shown in FIGS. 5 and 6 that the ventilation or exhaust system can be improved for a shelf configured for a 19-inch rack. The ventilation system described in the present disclosure is configured to assist with front-to-rear cooling. For example, the exhaust control device 50 may be configured to increase the width of the exhaust volume. Thus, the exhaust control device 50 may also help with front-to-rear cooling in a 19-inch frame.

According to some solutions for front-to-rear cooling in the 19-inch rack system, the casing 10 may include seven slots 12 and may use a blocking plate on the inlet side of the casing 10. The exhaust side may be left open to exhaust air into the cabinet to lower the maximum ambient temperature below 45° C.

Figure 7:
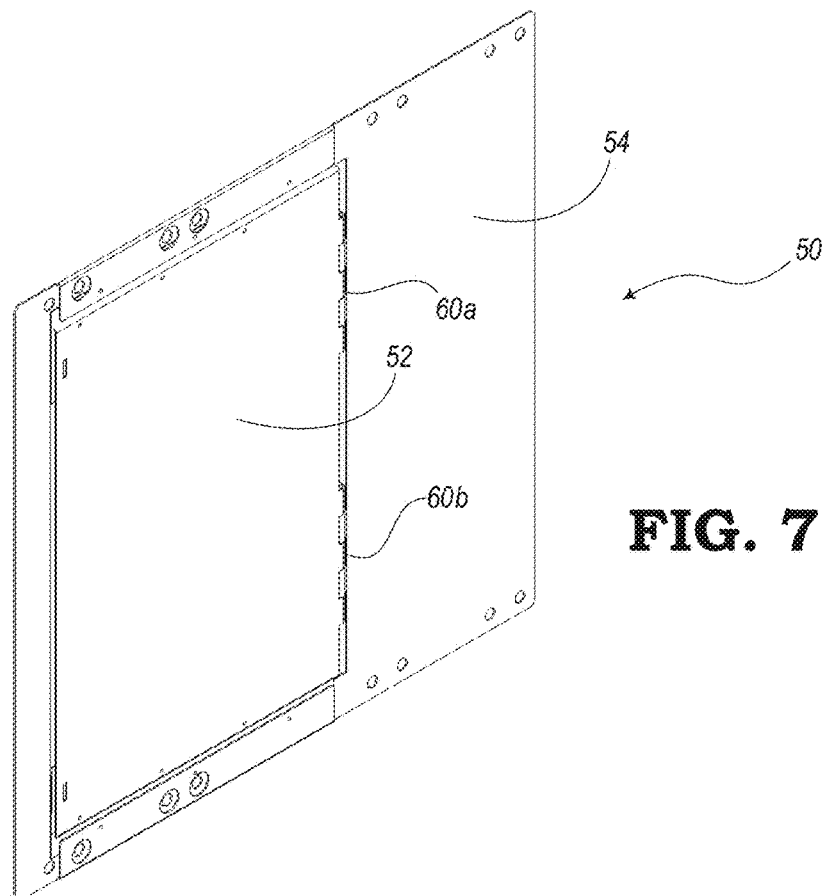
FIG. 7 is a diagram illustrating an isometric view of the exhaust control device in the collapsed position, according to various embodiments of the present disclosure.
Figure 8:
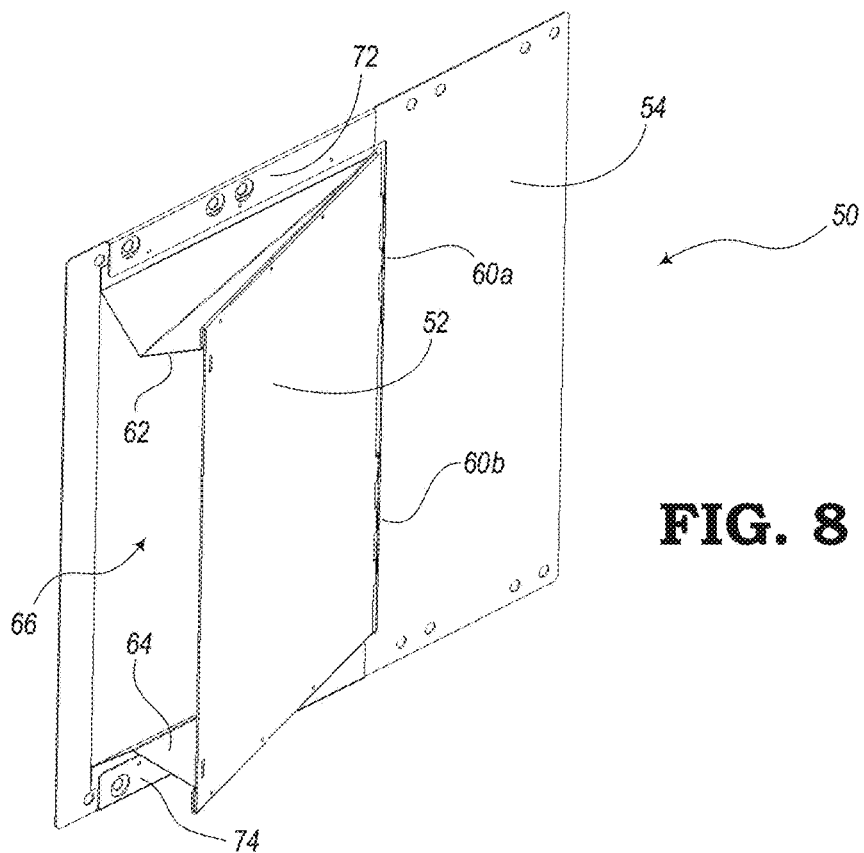
FIG. 8 is a diagram illustrating an isometric view of the exhaust control device in the expanded position, according to various embodiments of the present disclosure.
Figure 9A:
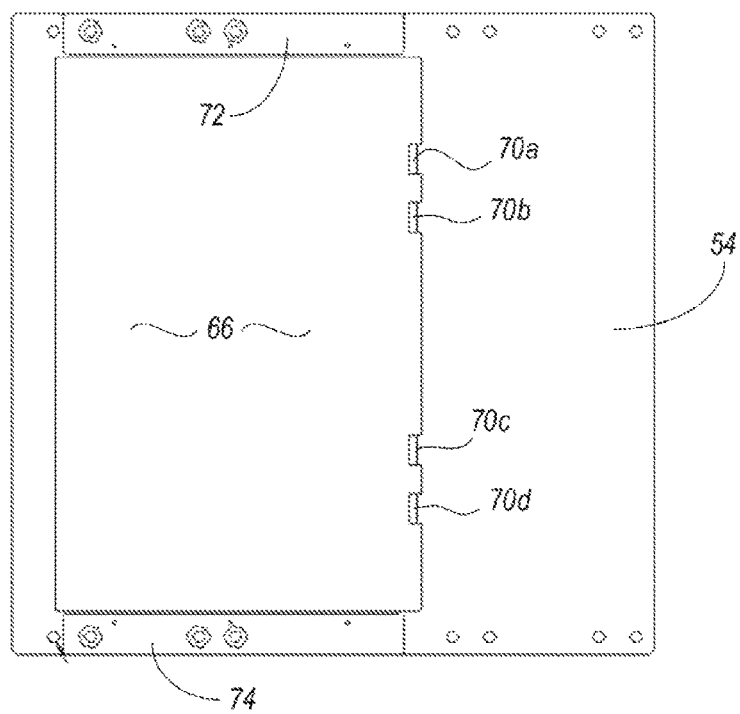
Figure 9B:
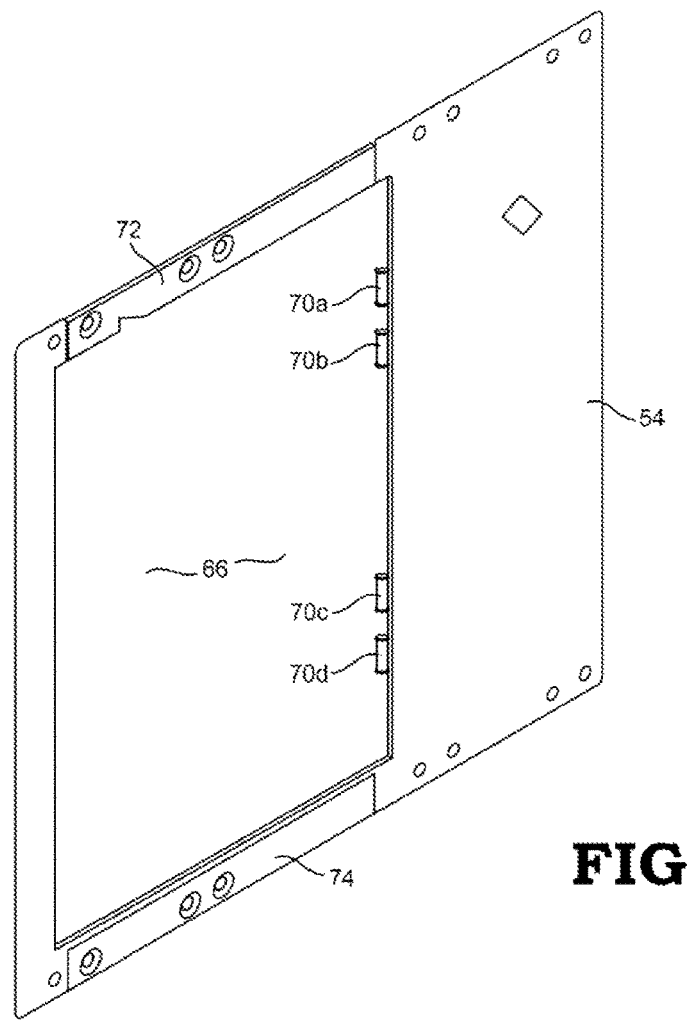

FIG. 7 is an isometric view showing an embodiment of the exhaust control device 50 in the collapsed position. FIG. 8 is an isometric view of the exhaust control device 50 in a (partially) expanded position. As mentioned above, the exhaust control device 50 includes at least the baffle 52 and the mount plate 54. In addition, the exhaust control device 50 includes one or more hinges, such as an upper hinge 60a and a lower hinge 60b. The upper hinge 60a and lower hinge 60b are configured to allow the baffle 52 to rotate or swivel with respect to the mount plate 54. The baffle 52 may be referred to as a hinged plate, vane, panel, etc., which may be held open by the air pressure created by a fan or other air circulating device.

As shown in FIG. 8, the exhaust control device 50 includes a top accordion pleat 62 and a bottom accordion pleat 64. The top and bottom accordion pleats 62, 64 are foldable in a bellows-type or accordion-type manner to allow the baffle 52 to be positioned in a closed position when the top and bottom accordion pleats 62, 64 are collapsed or folded and to allow the baffle to be positioned in an opened position when the top and bottom accordion pleats 62, 64 are expanded or extended out. The mount plate 54 includes a window 66 (e.g., opening, aperture, screen, mesh, etc.) to allow air to flow. The window 66 may be positioned, at least partially, in front of the side exhaust vent 58 (FIG. 4B). Also, the baffle 52 may be a flow-directing device configured to force the air flow in a rearward direction instead of the natural perpendicular direction out through the window 66 of the mount plate 54.

The baffle 52 and mount plate 54 may be formed of thin aluminum or stainless steel sheets, providing a substantially sturdy foundation. The top and bottom accordion pleats 62, 64, may be formed of a polycarbonate material (e.g., 20 mil Lexan) or other suitable material to allow for easy folding movement. Also, the material of the top and bottom accordion pleats 62, 64 may be a flame retardant fabric material. Sections of the top and bottom accordion pleats may be held or compressed within hems formed by the baffle 52 and mount plate 54. The exhaust control device 50 may be mounted on a side panel of the casing 10 or shelf. Once the shelf is installed in the frame system, the exhaust control device 50 is configured to open (e.g., as shown in FIGS. 3B, 4B, 5B, 6, and 8). In some embodiments, the assembly or exhaust control device 50 can be folded down to a thickness of about 2 mm to minimize its footprint in the shelf. The thinner the folded assembly, the more space that is left for intake vent 16, horizontal circuit cards 42, and cooling unit 44.

In conventional systems, air flow with horizontally oriented circuit cards 42 can easily go from a side inlet to a side exhaust, but this may likely not comply with NEBS standards. Air flow may be measured in ft³/min (i.e., Cubic Feet per Minute (CFM)) and is quite constant until the air flow is redirected within the shelf housing or casing. However, the embodiments of the present disclosure are configured to create enough air flow redirecting space to keep the CFM high enough to cool the horizontally cooled circuit cards 42. If flat blocker panels are assembled to the left and right sides of the shelf to force front to rear cooling, the air flow redirection reduces the CFM so much that the conventional ventilation systems may be unable to adequately cool the circuit packs. On the other hand, the embodiments of the present disclosure can overcome this redirection issue. When tested, the present embodiments with the expanding baffle 52 were proven to allow a high enough CFM to properly cool the circuit packs 42 and meet the NEBS air flow requirements.

FIGS. 9A-9E are diagram illustrating various views of an embodiment of the mount plate 54, which may be part of the exhaust control device 50 or other airflow control apparatus. In this embodiment, the mount plate 54 includes knuckles 70a, 70b, 70c, 70d (e.g., hinge knuckles). For example, the knuckles 70a, 70b may form part of the upper hinge 60a and the knuckles 70c, 70d may form part of the lower hinge 60b. The knuckles 70 may include a material (e.g., metal, aluminum, etc.) that is formed as tubular elements that may accept one or more hinge pins.

Also, the mount plate 54 further includes an upper crimping edge 72 (or upper hem) that may be formed at a top edge of the mount plate 54 near a top edge of the window 66. The mount plate 54 also includes a lower crimping edge 74 (or lower hem) that may be formed at a bottom edge of the mount plate 54 near a bottom edge of the window 66. During a manufacturing process, the crimping edges 72, 74 may be configured in an open state to receive end portions of the top accordion pleat 62 and bottom accordion pleat 64, respectively. Then, the crimping edges 72, 74 may be bent to a closed position to hold the end portions of the pleats 62, 64, respectively, in place. As shown in FIGS. 9C-9E, the upper and lower crimping edges 72, 74 may include bumps 78, 80, respectively, which may be configured to provide additional compression force on the pleats 62, 64 when crimped.

FIGS. 10A-10E are diagrams illustrating various views of an embodiment of the baffle 52 of the exhaust control device 50. In this embodiment, the baffle 52 includes knuckles 84a, 84b, 84c, 84d, 84e, 84f (e.g., hinge knuckles). For example, knuckles 84a, 84b, 84c may form part of the upper hinge 60a and may be aligned with knuckles 70a, 70b of the mount plate 54. Also, knuckles 84d, 84e, 84f may form part of the lower hinge 60b and may be aligned with knuckles 70c, 70d of the mount plate 54.

Figure 10A:
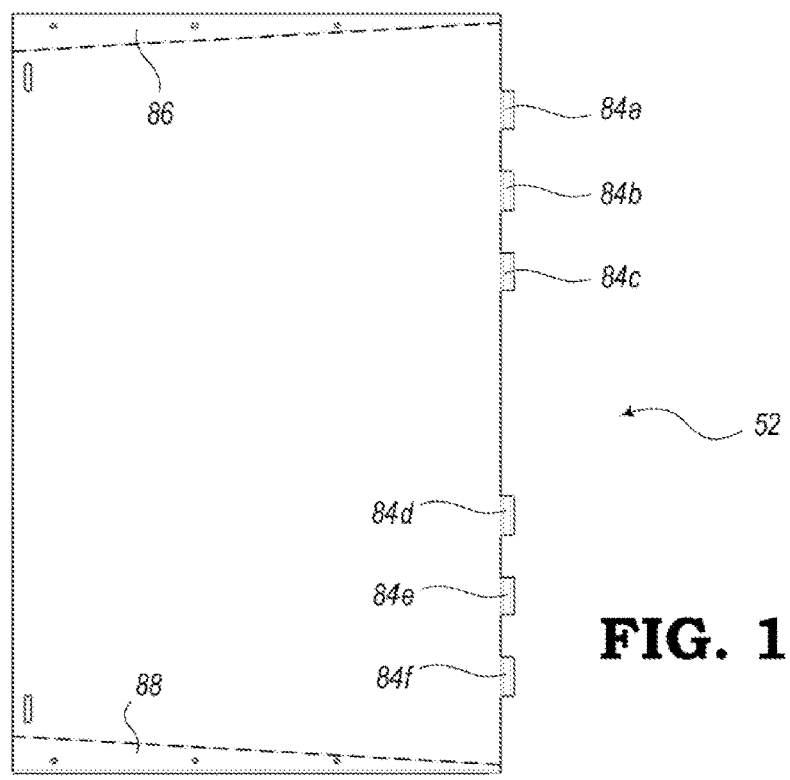
Figure 10B:
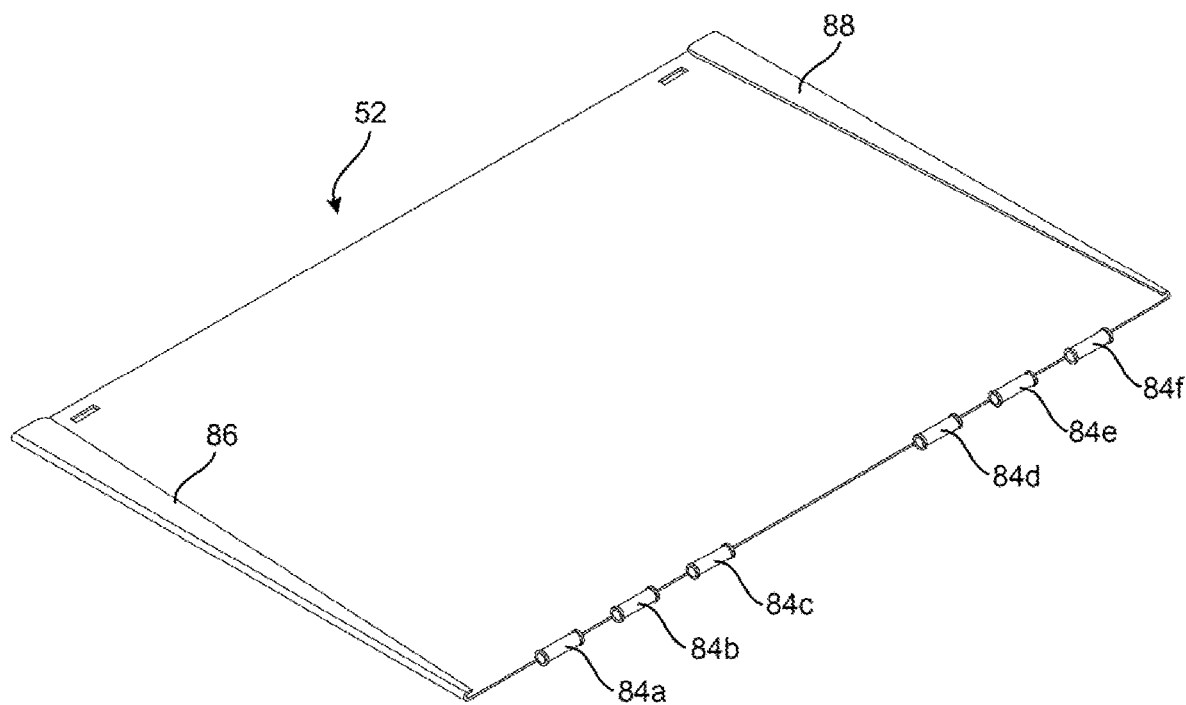

In addition, like the crimping edges 72, 74 of the mount plate 54, the baffle 52 may also include crimping edges, such as an upper crimping edge 86 and a lower crimping edge 88 (both shown in phantom in FIG. 10A). Again, the crimping edges 86, 88 may be referred to as hems for clamping onto an edge portion of the top and bottom accordion pleats 62, 64, respectively. The crimping edge 86 of the baffle 52 may include a bump 92 configured to provide additional compression force on the top accordion pleat 62 when crimped.

Also, the crimping edge 88 may include a bump 94 configured to provide additional compression force on the bottom accordion pleat 64 when crimped.

Figure 11:
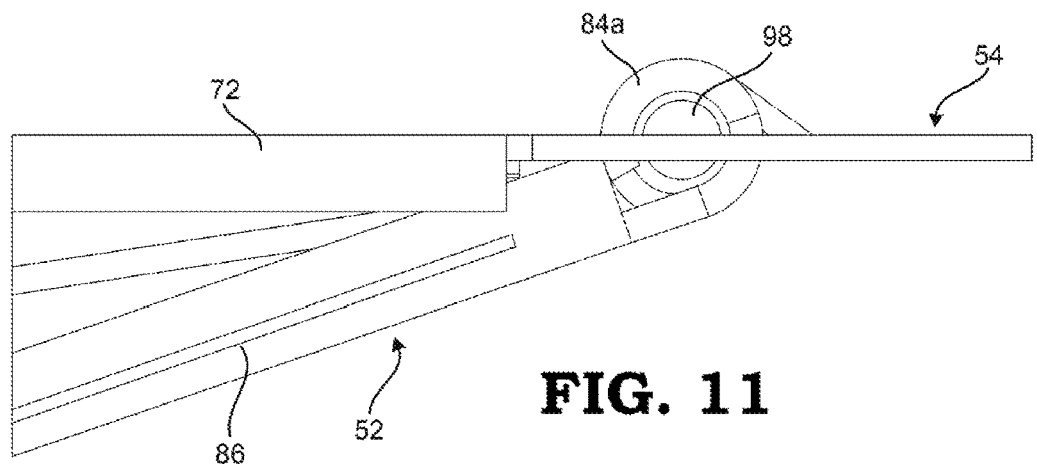
FIG. 11 is a diagram illustrating a top view of a hinge for enabling the baffle to swing between a collapsed position and an expanded position with respect to the mount plate, according to various embodiments.

FIG. 11 is a diagram illustrating a top view of the upper hinge 60a for enabling the baffle 52 to swing between a collapsed position and an expanded position with respect to the mount plate 54. It may be noted that the lower hinge 60b is hidden from view in FIG. 11. Also, FIG. 11 shows the uppermost knuckle 84a of the baffle 52, whereby the other knuckles (e.g., knuckles 70a, 70b, 70c, 70d of the mount plate 54 and knuckles 80b, 80c, 80d, 80e, 80f of the baffle 52) are aligned in a vertical orientation with the uppermost knuckle 84a and are hidden from view. Also shown in FIG. 11 are the upper crimping edge 72 of the mount plate 54 and the upper crimping edge 86 of the baffle 52. The upper hinge 60a further includes a pin 98 that runs through a tubular opening in each of the knuckles 84a, 70a, 84b, 70b, 84c. In some embodiments, the pin 98 may also run through tubular openings in the knuckles 84d, 70c, 84e, 70d, 84f of the lower hinge 60b. In another embodiment, a separate pin (not shown) may be run through the knuckles of the lower hinge 60b. One or both of the ends of the pin 98 (or pins) may be blocked for keeping the pin 98 (or pins) in place.

Figure 12A:
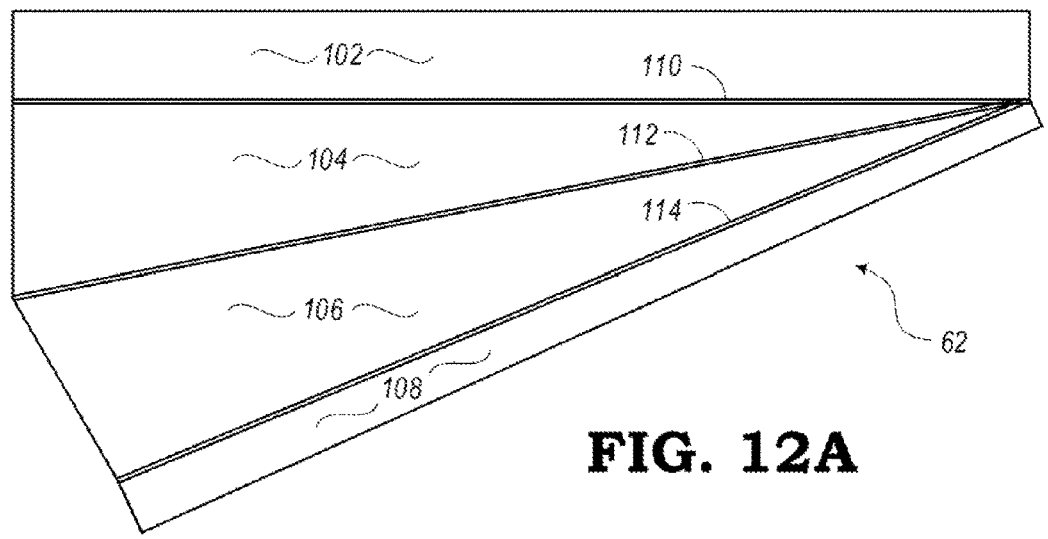
FIGS. 12A and 12B are diagrams illustrating a top view of a top accordion pleat and a bottom accordion pleat of the exhaust control device of FIGS. 7 and 8 before installation in the exhaust control device, according to various embodiments.
Figure 12B:
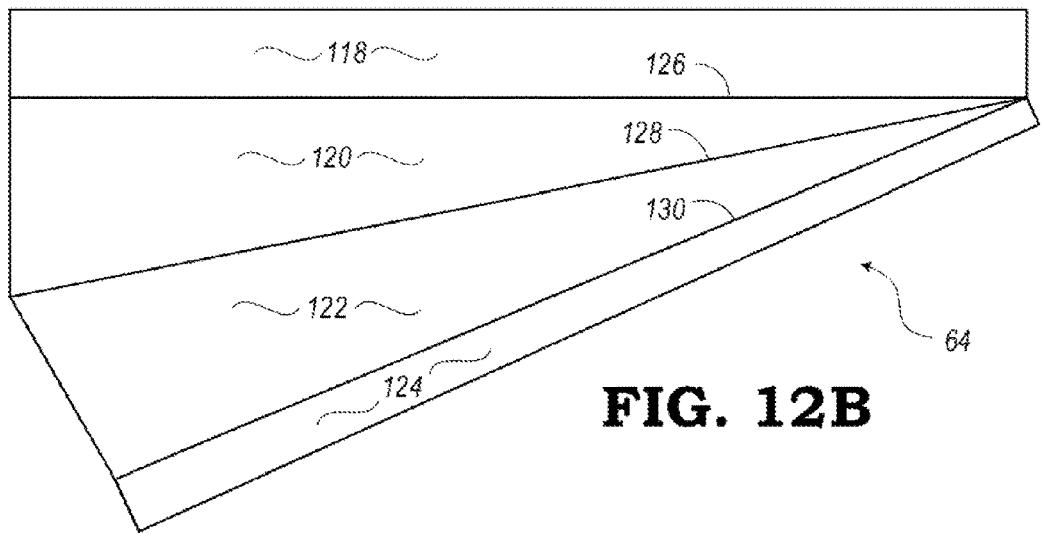

FIGS. 12A and 12B are diagrams illustrating a top view of the top accordion pleat 62 and the bottom accordion pleat 64, according to various embodiments. The accordion pleats 62, 64 are shown in FIGS. 12A and 12B in a laid-out state before they are installed in the exhaust control device 50. The accordion pleats 62, 64 may be cut or formed from a flat material.

The top accordion pleat 62 includes a first support strip 102, a first triangular fold element 104, a second triangular fold element 106, and a second support strip 108. Indentations 110, 112, 114 may be formed in the top accordion pleat 62 to separate one section 102, 104, 106, 108 from the others. The indentations 110, 112, 114 may be formed by removing material along a corresponding bending line, applying pressure to the bending lines, and/or by other suitable manufacturing processes for enabling the various sections 102, 104, 106, 108 to pivot with respect to each other. For attachment in the exhaust control device 50, the first support strip 102 is configured to be crimped and held in place by the upper crimping edge 72 of the mount plate 52 and the second support strip 108 is configured to be crimped and held in place by the upper crimping edge 86 of the baffle 52.

Similarly, the bottom accordion pleat 64 includes a first support strip 118, a first triangular fold element 120, a second triangular fold element 122, and a second support strip 124. Indentations 126, 128, 130 may be formed in the bottom accordion pleat 64 to separate one section 118, 120, 122, 124 from the others. The indentations 126, 128, 130 may be formed by removing material along a corresponding bending line, applying pressure to the bending lines, and/or by other suitable manufacturing processes for enabling the various sections 118, 120, 122, 124 to pivot with respect to each other. For attachment in the exhaust control device 50, the first support strip 118 is configured to be crimped and held in place by the lower crimping edge 74 of the mount plate 52 and the second support strip 124 is configured to be crimped and held in place by the lower crimping edge 88 of the baffle 52.

Therefore, according to various embodiments of the present disclosure, an apparatus (e.g., exhaust control device 50) may be configured to control airflow through the casing 10 or other shelf or chassis system supported on a rack, frame, or cabinet structure of a network. For example, the apparatus may include a mount plate (e.g., mount plate 54) configured to be attached to a side panel of the casing 10 for housing network equipment. The mount plate 54 may include a window (e.g., window 66 or another aperture or opening). Also, one or more hinges (e.g., upper hinge 60a and/or lower hinge 60b) may be arranged at an edge (e.g., right edge as shown in FIG. 8) of the window 66 of the mount plate 54. The apparatus may also include a baffle (e.g., baffle 52 or other vane, panel, etc.) that is pivotally attached to the one or more hinges 60a, 60b. The baffle 52 is configured to be arranged within a range of positions with respect to the mount plate 54 to control an amount of airflow through the window 66. Within this range of positions, the baffle 52 is configured to redirect the airflow in a front-to-back direction through the casing 10.

Furthermore, the apparatus described above may also include a top accordion pleat (e.g., top accordion pleat 62 or other suitable bellows-type or accordion-type expandable element) and a bottom accordion pleat (e.g., bottom accordion pleat 64 or other suitable bellow-type or accordion-type expandable element). The top accordion pleat 62 is configured to be attached between a top edge of the baffle 52 and a top edge of the window 66. The bottom accordion pleat 64 is configured to attach a bottom edge of the baffle to a bottom edge of the window. The top accordion pleat 62 and bottom accordion pleat 64 are configured to limit the movement of the baffle 52 with respect to the mount plate 54 (e.g., limited to the above-mentioned range of positions). The mount plate 54 may further include a first crimping edge (e.g., top crimping edge 72) arranged near the top edge of the window 66 and a second crimping edge (e.g., bottom crimping edge 74) arranged near the bottom edge of the window 66. The first crimping edge 72 may be configured to hold the first support strip 102 of the top accordion pleat 62. Also, the second crimping edge 74 may be configured to hold the first support strip 118 of the bottom accordion pleat 64.

The baffle 52 may further include a first crimping edge (e.g., upper crimping edge 86) arranged at the top edge thereof and a second crimping edge (e.g., lower crimping edge 88) arranged at the bottom edge thereof. The first crimping edge 86 may be configured to crimp and hold a second support strip 108 of the top accordion pleat 62 and the second crimping edge 88 may be configured to crimp and hold a second support strip 124 of the bottom accordion pleat 64. The top accordion pleat 62 may also include a plurality of triangular fold elements 104, 106 connected together and configured to fold with respect to each other. The bottom accordion pleat 64 may also include a plurality of triangular fold elements 120, 122 connected together and configured to fold with respect to each other. The baffle 52, top accordion pleat 62, and bottom accordion pleat 64 may include a flame-retardant material.

Also, according to various embodiments, the casing 10 may be a shelf, chassis, or other shelf structure or system configured to be attached to a rack, frame, cabinet, etc. of a network element. The above-mentioned apparatus may further include a clasp (e.g., adhesive, tape, latch, etc.) (see FIG. 14) configured to hold the baffle 52 in a closed position on the mount plate 54 during a process of installing the shelf on the rack. The shelf or casing 10 may include a plurality of horizontal slots 12 configured to support a plurality of circuit packs and network cards 42. The rack may include a 19-inch wide frame with four vertically oriented upright posts (e.g., upright posts 18, 20, 38, 40). The baffle 52 may be configured to be moved within the range of positions between one of the front upright posts (e.g., front-left upright post 18) and one of the rear upright posts (e.g., rear-left upright post 38) on one side (e.g., left side) of the rack.

Figure 18A:
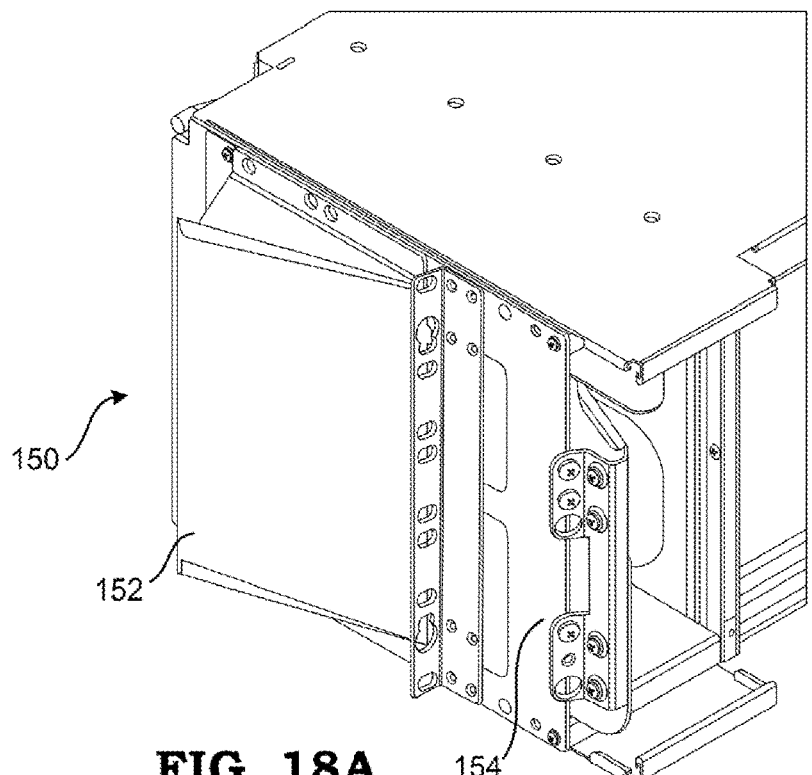
FIGS. 18A and 18B are diagrams illustrating different views of an intake control device in an expanded position, according to various embodiments.
Figure 18B:
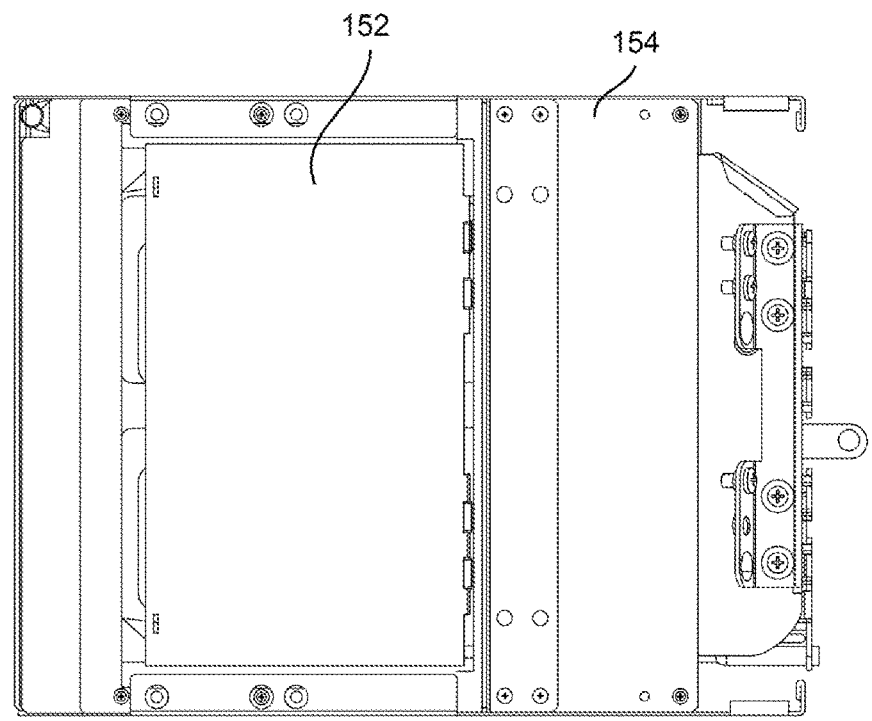

In some embodiments, the apparatus may further comprise a second airflow control device in addition to the exhaust control device 50. For example, the second airflow control device (e.g., as shown in FIGS. 18A and 18B) may be an intake control device for controlling the inflow of air into the casing 10. This second airflow control device may be similar to the exhaust control device 50 and may include a second mount plate configured to be attached to a side panel (e.g., opposite side from the exhaust control device 50) of the casing 10. The second mount plate may include a second window, a second set of one or more hinges arranged at an edge of the second window of the second mount plate, and a second baffle pivotally attached to the second set of one or more hinges. The second baffle may also be configured to be arranged within a range of positions with respect to the second mount plate to control an amount of airflow through the second window. Within this range of positions, the second baffle may also be configured to redirect the airflow in the front-to-back direction through the casing 10. Also, the apparatus may also include a fan (not shown) configured for directing the airflow in the front-to-back direction (or in a back-to-front direction) through the casing 10.

FIGS. 13A-13C are diagrams illustrating various views of the top accordion pleat 62 and bottom accordion pleat 64 when the baffle 52 is in a partially expanded position. The apparatus may be configured such that the top and bottom accordion pleats 62, 64 may be folded in a collapsed or closed position for installation of the casing 10. After installation, the assembly with the baffle 52 may be allowed for expansion. The baffle 52 may be positioned behind the upright post 18 to allow for maximum opening angle and may be flame-retardant. The horizontally arranged circuit cards 42 may therefore be adequately cooled when mounted in a 19-inch frame, which improves upon the conventional shelves (for supporting horizontal circuit cards) that are not able to achieve NEBS compliance in the 19-inch frame. Also, the embodiments of the present disclosure allow for NEBS compliance without having to increase the height of the system to add an external ducting system that would take up space on the rack or cabinet.

Figure 14:
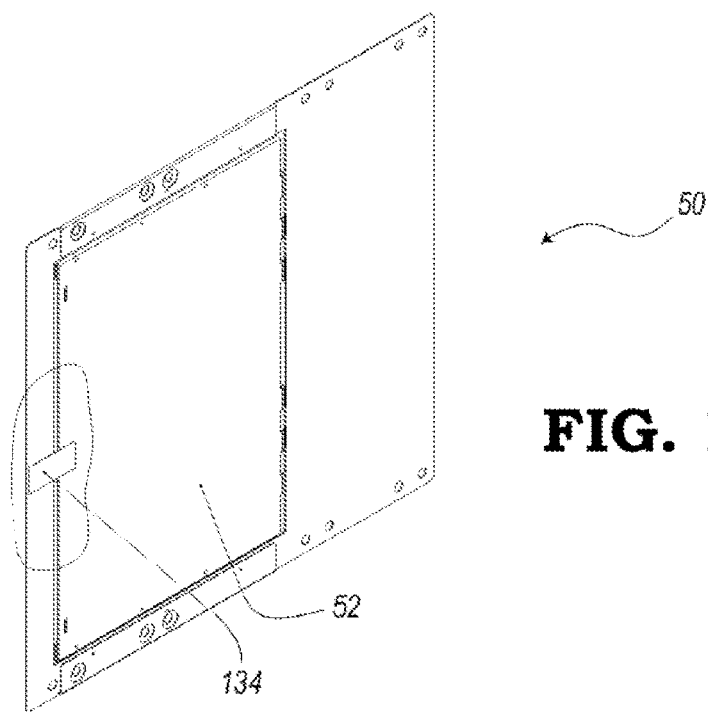
FIG. 14 is a diagram illustrating the exhaust control device in a closed or collapsed position during an installation process, according to various embodiments.

FIG. 14 is a diagram illustrating the exhaust control device 50 in a closed or collapsed position during an installation process. The closed baffle 52 may be held in place for installation by strip of tape 134 or another clasp, clasping component, latch, temporary adhesive material, etc. Once installed, an installer may simply reach into a fan cavity and push the baffle 52 outward to release the temporary tape 134 which keeps it closed during installation. The fan may then be installed after the opening is expanded. The air pressure created by the operating fan may also help to keep the baffle 52 at least partially open.

Figure 15:
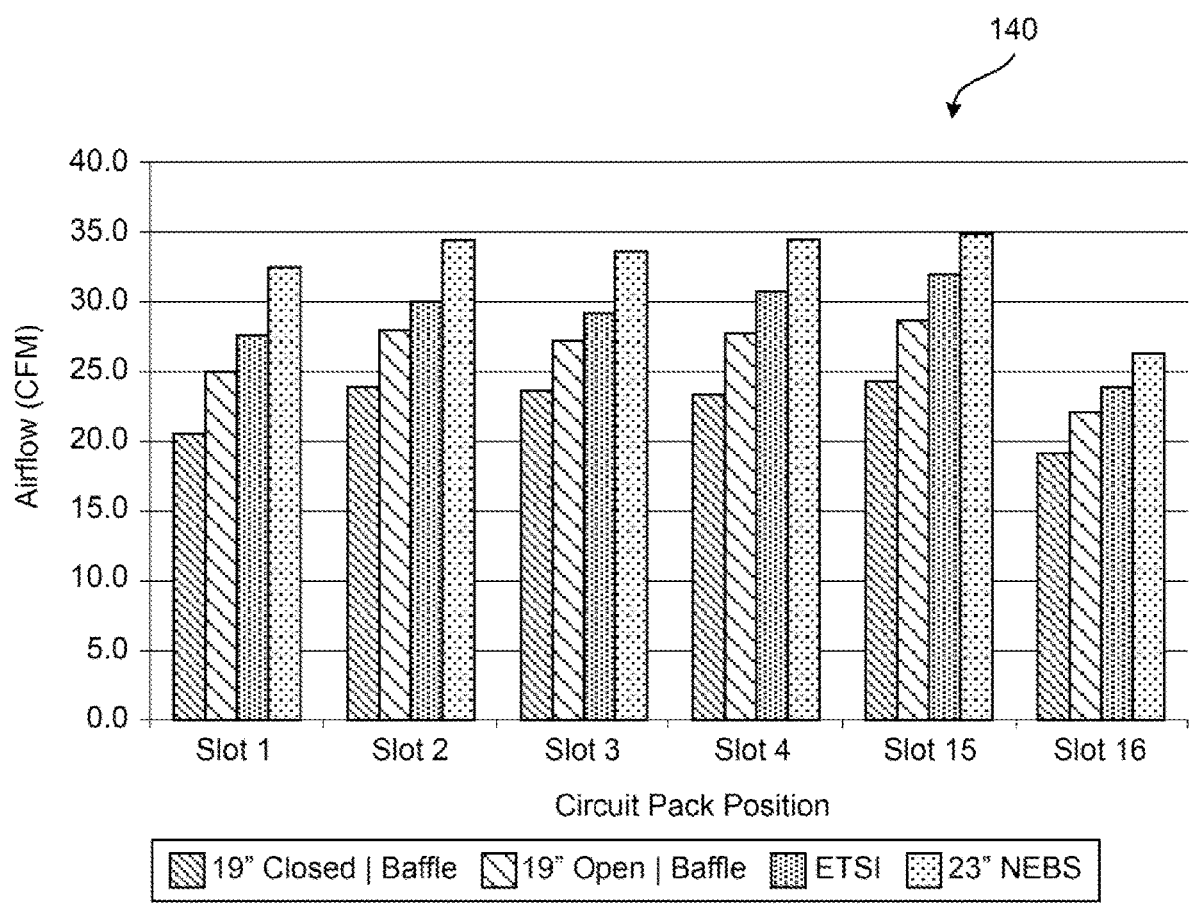
FIG. 15 is a chart illustrating the front-to-rear flow rate at different circuit pack positions for different rack sizes and baffle positions, according to various embodiments.
Figure 16A:
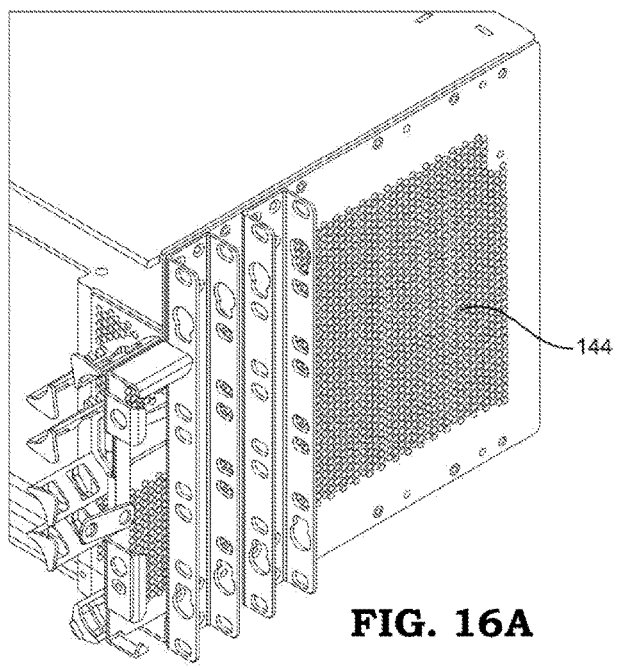
FIGS. 16A-16E are diagrams illustrating different views of different bracket mounting locations and set-backs, according to various embodiments.
Figure 16B:
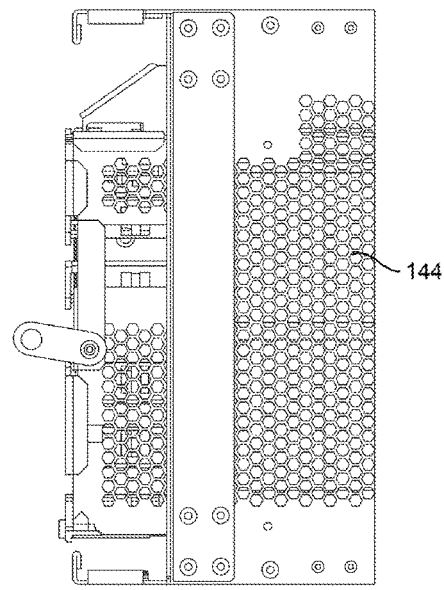
Figure 16C:
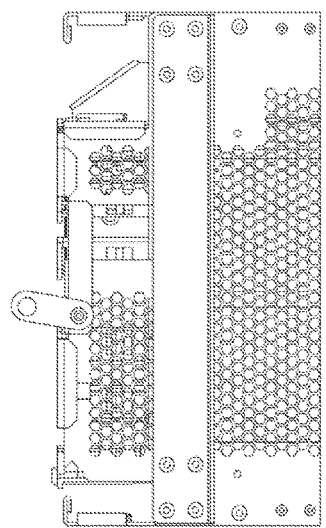
Figure 16D:
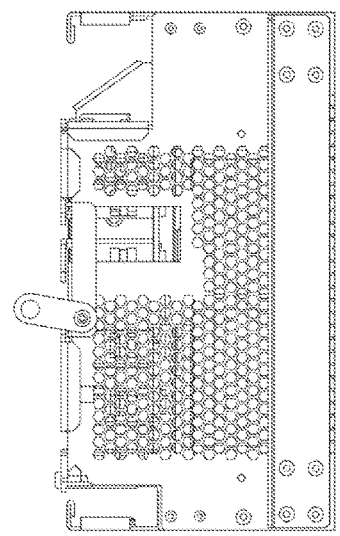
Figure 16E:
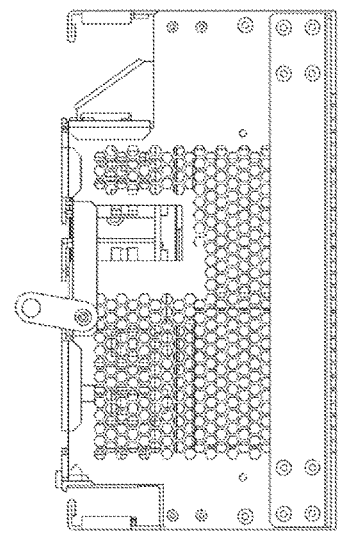

FIG. 15 is a chart 140 illustrating the front-to-rear flow rate at different circuit pack positions for different rack sizes and baffle positions. For example, FIG. 15 shows the increased air flow in each circuit pack slot 12 when the expanding exhaust (e.g., created by the exhaust control device 50 is in the open position. As a result of incorporating the exhaust control device 50 in the casing 10, it can be seen that there is an increase in the airflow, which is enough to attain NEBS compliance in a front-to-rear cooling set-up. The chart 140 also shows the air flow performance with the baffle 52 closed and opened (expanded ventilation volume).

Figure 17A:
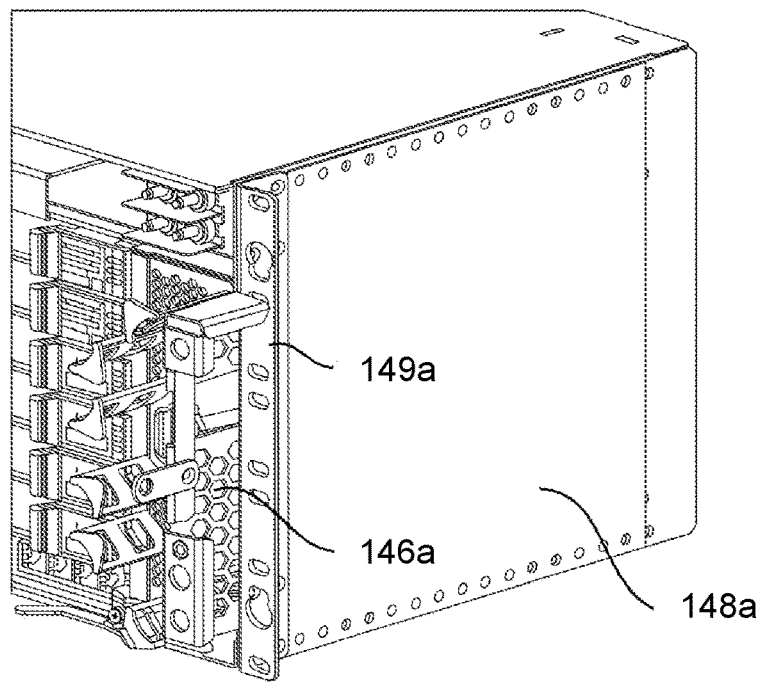
FIGS. 17A and 17B are diagrams illustrating an isometric view of blocking plates for different bracket systems, according to various embodiments.
Figure 17B:
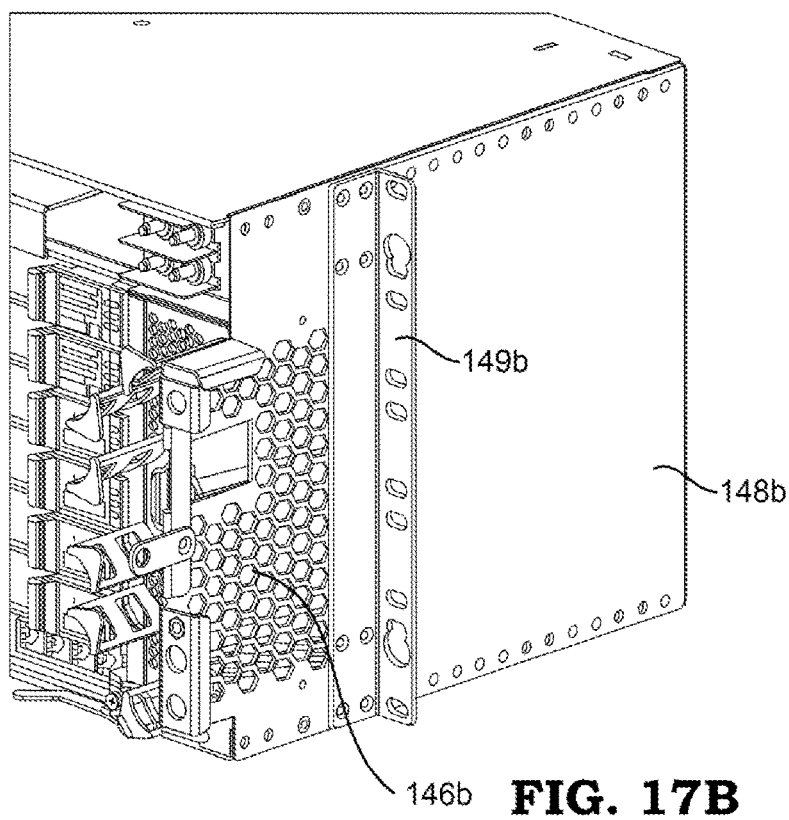

FIGS. 16A-16E are diagrams illustrating different views of embodiments of different bracket mounting locations and set-backs. FIGS. 17A and 17B show isometric views of blocking plates for different bracket systems, according to various embodiments. In some embodiments, the brackets may include an air blocking kit and may comprise stainless steel (e.g., for GR 3108 OSP-2). In FIG. 17A, an air intake 146a is shown with side panel 148a and an upright post 149a. In FIG. 17B, an air intake 146b is shown with side panel 148b and an upright post 149b.

FIGS. 18A and 18B are diagrams illustrating different views of an intake control device 150 in an expanded position. It may be noted that the intake control device 150 may include the same or similar features as the exhaust control device 50 described above. Similarly, the intake control device 150 may include an expandable baffle 152 pivotable with respect to a mount plate 154. According to various embodiments, the intake control device 150 may be configured to replace the side panel 48 shown in FIGS. 2A and 2B. Therefore, the intake control device 150 can allow air to flow in a front-to-back direction through an opening formed by the opened baffle 152 and out the exhaust control device 50. As such, the internal airflow may be directed diagonally (e.g., front-right to back-left).

Fabric Link Parking Systems

In some systems, it may be possible to have external cabling, optical fibers, Quad Small Form-factor Pluggable, Double-Density (QSFP-DD) components (e.g., "pluggables," fabric links, etc.) used for fabric path interconnections between client/line cards and fabric cards. In the past, these fabric links would have been on backplanes using traces on PCB material. Typically, customers may pre-cable some, if not all, of their fabric links. This can make any additions, at some future time, much simpler and can allow for a cleaner initial and final installation of the fabric links.

However, these fabric links may eventually be connected to future-installed fabric cards and/or client/line cards. Before the cards are installed, the space where they would need to be filled with filler cards. The filler card is used to ensure that a continuous Electro-Magnetic Interference (EMI) cage is maintained and can block any possible airflow bypass that the empty area creates before a fabric/client/line card is used.

The present disclosure further includes embodiments of systems and methods for assisting in this respect. For example, some embodiments may include adding a feature to the filler card to "park" and hold in place the above-mentioned fabric links until the fabric link is inserted into the fabric/client/line cards. As a result, this can ease the initial installation and pre-planning of the system fabric link utilization and allow for a fast and clean installation of future fabric/client/line cards with minimal fabric link disruptions.

The parking feature for the added filler card may include one or more of the following features: a) added EMI shielded fake pluggable sockets to the filler card, where the fabric link ends may connect into and hold the fabric link in place until a fabric/client/line card is used, b) added fingered blades on the filler card faceplate surface to hold the fabric links ends, c) added tray created in the filler card faceplate where the fabric link ends will sit.

Figure 19A:
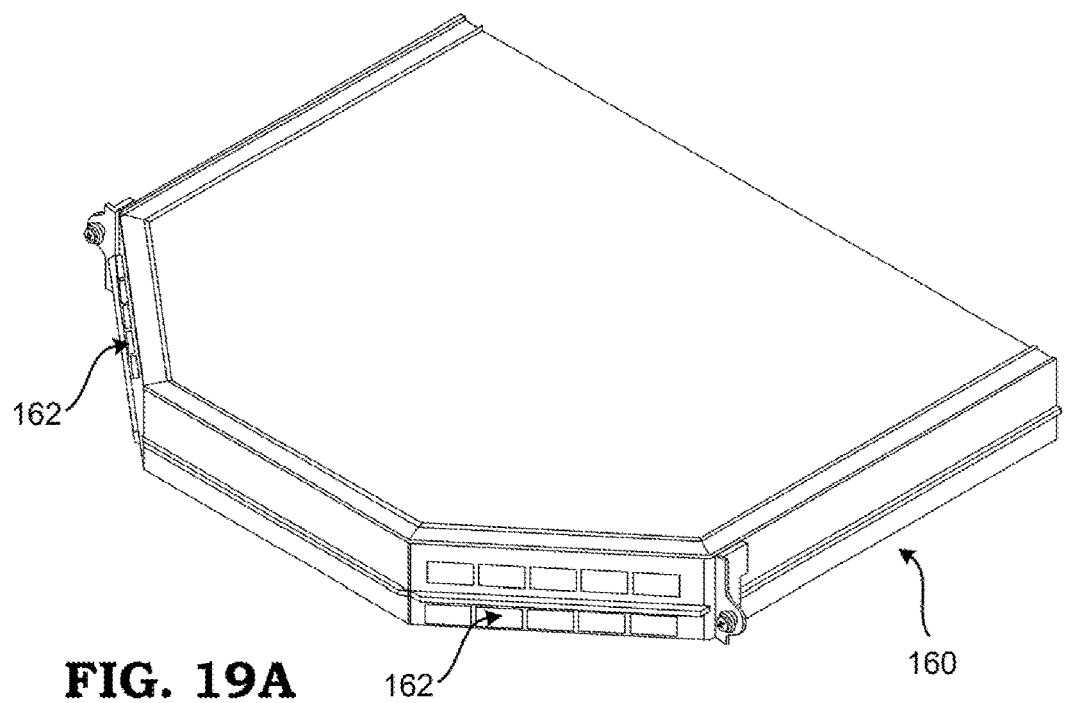
FIGS. 19A-19C are diagrams illustrating different views of a fabric link parking system using cages or slots, according to various embodiments.
Figure 19B:
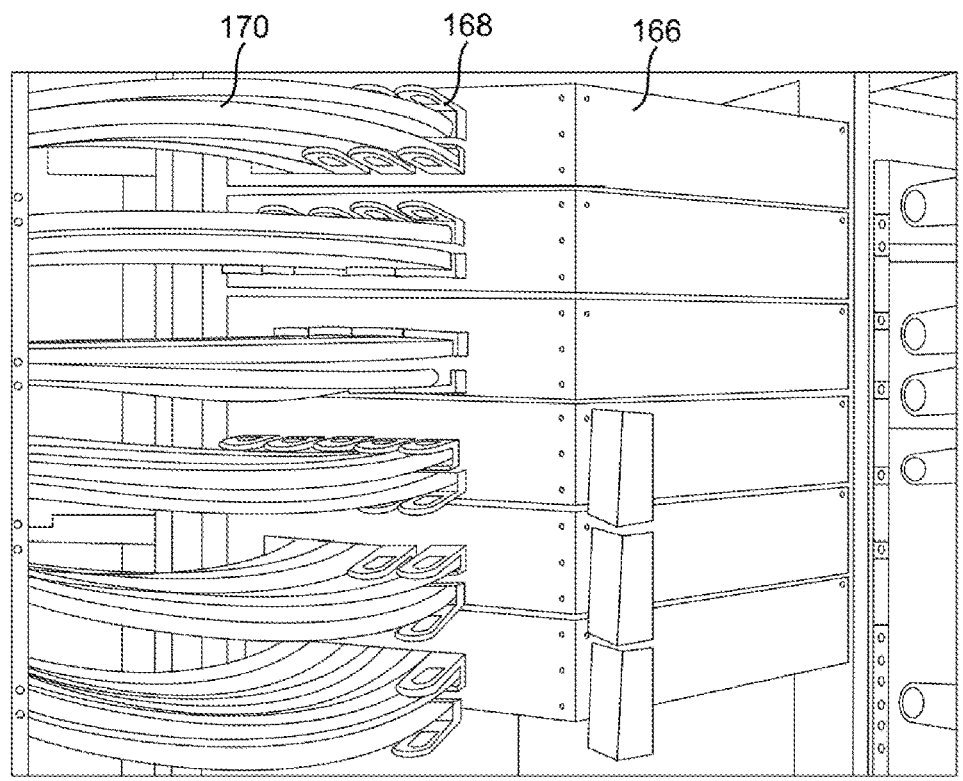
Figure 19C:
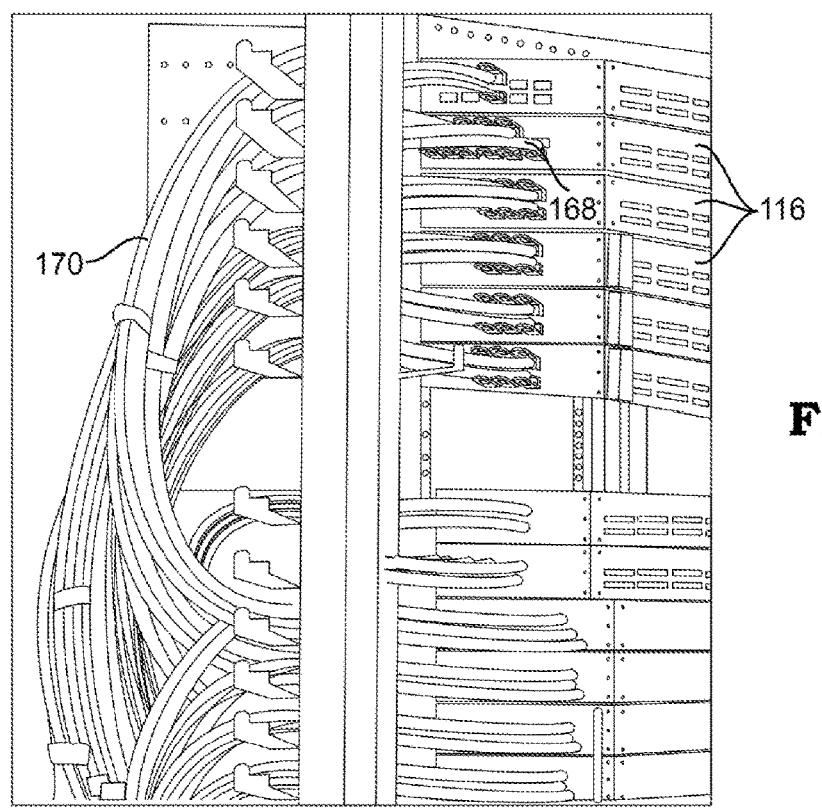

FIGS. 19A-19C are diagrams illustrating different views of an embodiment of a fabric link parking system 160 using cages or slots. In this first example using cages or slots, a filler 162 may be included with fabric link parking. The cages, slots, fingers, trays, etc. may allow for one or more QSFP-DD devices to be held (parked) in place by the filler card (with no electrical connectivity). This holds the fabric Active Optical Cables (AOCs) and Active Electrical Cables (AECs) (e.g., fibers, QSFP-DD devices, etc.) fabric link in place until a traffic carrying card is used (e.g., fabric/client/line card). FIGS. 19B and 19C show boxes 166 (e.g., active or filler cards), connectors 168 (e.g., QSFP-DD devices), and cables 170 (e.g., AOCs/AECs)

The first example may use holes in a faceplate with either cages that the QSFP-DDs devices plug into or just a slot or tray opening where the QSFP-DD device would be placed. The right-hand side of FIG. 19 shows a mock-up mechanical test done in the lab. This can provide an example view of what a filler with QSFP-DD cages could look like and shows the cabling 170 and why such a filler that includes parking will be useful to allow good placement of pre-cabled fabric links until "real" cards are installed.

Figure 20:
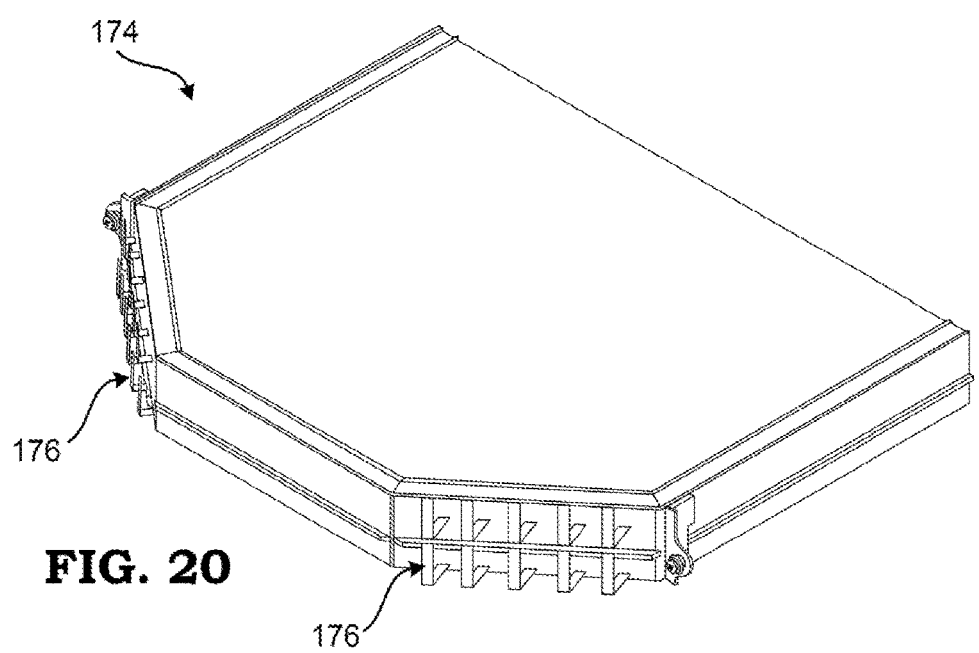
FIG. 20 is a diagram illustrating an isometric view of a fabric link parking system using fingers, according to various embodiments.

FIG. 20 is a diagram illustrating an isometric view of an embodiment of a fabric link parking system using fingers. In this embodiment using fingers, a box 174 or card may include fingers 176. This allows for a filler with fabric link parking. The cages, slots, fingers, trays, etc. may allow for QSFP-DD devices to be held (parked) in place by the filler card (with no electrical connectivity). This holds the fabric AOCs/AECs (or fiber, QSFP-DD) fabric link in place until a traffic carrying card is used (e.g., fabric/client/line card). The second example does not have holes in the faceplate, but rather may have external hooks or fingers 176 that the QSFP-DD and or cables or fibers would be fastened to.

The first and second examples of FIGS. 19 and 20 may therefore be configured to provide fillers for temporary parking. The filler may include a park feature that may hold the fabric links in their exact final place, which can allow for better pre-planning and installation.

Conventional system may include park feature on "real" cards, but not on a "filler" card. Conventional methods may simply include tie-wrapping the fabric links to some rack upright close by. However, this may be insufficient as it is not the exact location or final use of the fabric links. Thus, the conventional systems and methods do not provide a place to park fabric links in place or to place links in their exact final usage position when a filler is used. However, the embodiments of FIGS. 19 and 20 overcome this deficiency by providing such a park feature on a filler card.

Although the present disclosure has been illustrated and described herein with reference to various embodiments and examples, it will be readily apparent to those of ordinary skill in the art that other embodiments and examples may perform similar functions, achieve like results, and/or provide other advantages. Modifications, additions, or omissions may be made to the systems, apparatuses, and methods described herein without departing from the spirit and scope of the present disclosure. All equivalent or alternative embodiments that fall within the spirit and scope of the present disclosure are contemplated thereby and are intended to be covered by the following claims.

What is claimed is:

1. A network element comprising:
    a shelf having a side exhaust vent and configured to support one or more cards and a cooling unit; and
    an exhaust control device over the side exhaust vent, wherein the exhaust control device is configured to redirect airflow from a side direction to a rear direction.

2. The network element of claim 1, wherein the exhaust control device includes a baffle that is configured to open based on air flow out the side exhaust vent and redirect the airflow to the rear direction.

3. The network element of claim 1, wherein the shelf is configured to mount in a 19-inch width rack.

4. The network element of claim 1, wherein the exhaust control device includes
- a mount plate configured to be attached to a side panel of the shelf, the mount plate including a window;
- one or more hinges arranged at an edge of the window of the mount plate; and
- a baffle pivotably attached to the one or more hinges, the baffle configured to be arranged within a range of positions with respect to the mount plate to control an amount of airflow through the window;
- wherein, within the range of positions, the baffle is configured to redirect the airflow in a front-to-back direction through the casing.

5. The network element of claim 4, further comprising a top accordion pleat and a bottom accordion pleat, the top accordion pleat configured to be attached between a top edge of the baffle and a top edge of the window, the bottom accordion pleat configured to be attached between a bottom edge of the baffle and a bottom edge of the window.

6. The network element of claim 1, wherein the cooling unit includes a fan for directing the airflow in the front-to-back direction through the side exhaust vent and the exhaust control device.

7. An apparatus configured to control airflow, the apparatus comprising:
- a mount plate configured to be attached to a side panel of a casing for housing network equipment, the mount plate including a window;
- one or more hinges arranged at an edge of the window of the mount plate; and
- a baffle pivotably attached to the one or more hinges, the baffle configured to be arranged within a range of positions with respect to the mount plate to control an amount of airflow through the window;
- wherein, within the range of positions, the baffle is configured to redirect the airflow in a front-to-back direction through the casing.

8. The apparatus of claim 7, further comprising a top accordion pleat and a bottom accordion pleat, the top accordion pleat configured to be attached between a top edge of the baffle and a top edge of the window, the bottom accordion pleat configured to be attached between a bottom edge of the baffle and a bottom edge of the window.

9. The apparatus of claim 8, wherein the top accordion pleat and bottom accordion pleat are configured to limit the movement of the baffle with respect to the mount plate to within the range of positions.

10. The apparatus of claim 8, wherein the mount plate further comprises a first crimping edge arranged near the top edge of the window and a second crimping edge arranged near the bottom edge of the window, the first crimping edge configured to hold a first support strip of the top accordion pleat, the second crimping edge configured to hold a first support strip of the bottom accordion pleat.

11. The apparatus of claim 10, wherein the baffle further comprises a first crimping edge arranged at the top edge thereof and a second crimping edge arranged at the bottom edge thereof, the first crimping edge configured to hold a second support strip of the top accordion pleat, the second crimping edge configured to hold a second support strip of the bottom accordion pleat.

12. The apparatus of claim 8, wherein the top accordion pleat includes a plurality of triangular fold elements connected together and configured to fold with respect to each other, and wherein the bottom accordion pleat includes a plurality of triangular fold elements connected together and configured to fold with respect to each other.

13. The apparatus of claim 8, wherein the baffle, top accordion pleat, and bottom accordion pleat include a flame-retardant material.

14. The apparatus of claim 7, wherein the casing is a shelf configured to be attached to a rack of a network element.

15. The apparatus of claim 14, further comprising a clasp configured to hold the baffle in a closed position on the mount plate during a process of installing the shelf on the rack.

16. The apparatus of claim 14, wherein the shelf includes a plurality of horizontal slots configured to support a plurality of circuit packs and network cards.

17. The apparatus of claim 14, wherein the rack includes a 19-inch wide frame with four vertically oriented upright posts.

18. The apparatus of claim 17, wherein the baffle is configured to be moved within the range of positions between a front upright post and a rear upright post on one side of the rack.

19. The apparatus of claim 7, further comprising:
- a second mount plate configured to be attached to an opposite side panel of the casing, the second mount plate including a second window;
- a second set of one or more hinges arranged at an edge of the second window of the second mount plate; and
- a second baffle pivotably attached to the second set of one or more hinges, the second baffle configured to be arranged within a range of positions with respect to the second mount plate to control an amount of airflow through the second window;
- wherein, within the range of positions, the second baffle is configured to redirect the airflow in the front-to-back direction through the casing.

20. The apparatus of claim 7, further comprising a fan for directing the airflow in the front-to-back direction through the casing.

* * * * *